US010235175B2

(12) United States Patent
Dixon et al.

(10) Patent No.: US 10,235,175 B2
(45) Date of Patent: Mar. 19, 2019

(54) PROCESSORS, METHODS, AND SYSTEMS TO RELAX SYNCHRONIZATION OF ACCESSES TO SHARED MEMORY

(71) Applicant: Intel Corporation, Santa Clara, CA (US)

(72) Inventors: Martin G. Dixon, Portland, OR (US); William C. Rash, Saratoga, CA (US); Yazmin A. Santiago, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 240 days.

(21) Appl. No.: 15/089,883

(22) Filed: Apr. 4, 2016

(65) Prior Publication Data
US 2016/0216967 A1    Jul. 28, 2016

Related U.S. Application Data

(63) Continuation of application No. 13/844,729, filed on Mar. 15, 2013, now Pat. No. 9,304,940.

(51) Int. Cl.
G06F 12/00    (2006.01)
G06F 9/30    (2018.01)
G06F 12/14    (2006.01)
G06F 12/0804    (2016.01)
G06F 12/0815    (2016.01)
(Continued)

(52) U.S. Cl.
CPC ...... *G06F 9/30087* (2013.01); *G06F 12/0804* (2013.01); *G06F 12/0815* (2013.01); *G06F 12/0862* (2013.01); *G06F 12/14* (2013.01); *G11C 7/1072* (2013.01);
(Continued)

(58) Field of Classification Search
None
See application file for complete search history.

(56) References Cited

U.S. PATENT DOCUMENTS 6,748,518 B1 * 6/2004 Guthrie .............. G06F 9/30087
711/144
2007/0143755 A1 6/2007 Sahu et al.
(Continued)

FOREIGN PATENT DOCUMENTS

CN    1484169 A    3/2004
JP    02-287857 A    11/1990
(Continued)

OTHER PUBLICATIONS

Office Action received for Chinese Patent Application No. 201410097357.6, dated Nov. 6, 2017, 26 pages of Chinese Office Action including 16 pages of English Translation.
(Continued)

*Primary Examiner* — Daniel D Tsui
(74) *Attorney, Agent, or Firm* — NDWE, LLP

(57) ABSTRACT

A processor of an aspect includes a plurality of logical processors. A first logical processor of the plurality is to execute software that includes a memory access synchronization instruction that is to synchronize accesses to a memory. The processor also includes memory access synchronization relaxation logic that is to prevent the memory access synchronization instruction from synchronizing accesses to the memory when the processor is in a relaxed memory access synchronization mode.

18 Claims, 16 Drawing Sheets

(51) Int. Cl.
*G06F 12/0862* (2016.01)
*G11C 7/10* (2006.01)
(52) U.S. Cl.
CPC .............. *G06F 2212/1052* (2013.01); *G06F 2212/6028* (2013.01); *Y02D 10/13* (2018.01)

(56) References Cited

U.S. PATENT DOCUMENTS

| | | | |
|---|---|---|---|
| 2008/0109604 A1* | 5/2008 | Reilly | G06F 12/0813 711/118 |
| 2008/0307422 A1 | 12/2008 | Kurland et al. | |
| 2009/0300294 A1 | 12/2009 | Moyer et al. | |
| 2010/0100688 A1* | 4/2010 | Harper | G06F 11/0715 711/145 |
| 2013/0024662 A1 | 1/2013 | Renganarayana et al. | |
| 2014/0281196 A1 | 9/2014 | Dixon et al. | |
| 2014/0281429 A1* | 9/2014 | Brown | G06F 9/30087 712/226 |

FOREIGN PATENT DOCUMENTS

| | | |
|---|---|---|
| JP | 11-259437 A | 9/1999 |
| JP | 11-328140 A | 11/1999 |
| JP | 2000-057105 A | 2/2000 |
| JP | 2001-282549 A | 10/2001 |
| JP | 2003-048370 A | 2/2003 |
| JP | 2006-185232 A | 7/2006 |
| JP | 2008-112400 A | 5/2008 |
| JP | 2010-061522 A | 3/2010 |
| JP | 2011-128975 A | 6/2011 |
| JP | 2014-532937 A | 12/2014 |
| WO | 2013/066988 A1 | 5/2013 |

OTHER PUBLICATIONS

Response for Korean Patent Application No. 10-2014-0029403 filed on Jul. 27, 2015 to Office Action dated May 27, 2015, 21 pages.
Response for U.S. Appl. No. 13/844,729, filed Jun. 9, 2015 to Non-Final Office Action dated Jan. 6, 2015, 10 pages.
Response for United Kingdom Patent Application No. 1402964.9 filed on Feb. 26, 2016 to Examination Report dated Nov. 4, 2015, 3 pages.
Response for United Kingdom Patent Application No. 1402964.9 filed on Mar. 9, 2015 to Combined Search and Examination Report dated Jul. 25, 2014, 4 pages.
Response for Japanese Patent Application No. 2014-028277, filed on Aug. 12, 2015 to Office Action dated Feb. 17, 2015, 27 pages of Japanese Response to Office Action including 1 page of partial English Translation.
Response for Japanese Patent Application No. 2014-028277, filed on Mar. 15, 2016 to Office Action dated Sep. 15, 2015, 23 pages of Japanese Response to Office Action including 1 page of partial English Translation.
Response for Chinese Patent Application No. 201410097357.6 filed on Jun. 15, 2017 to Office Action dated Nov. 30, 2016, 14 pages.
Notice of Allowance received for Japanese Patent Application No. 2014-028277, dated Aug. 9, 2016, 4 pages of Japanese Notice of Allowance including 2 pages of Partial English Translation.
Office Action received for Chinese Patent Application No. 201410097357.6, dated Nov. 30, 2016, 11 pages of Chinese Office Action Only.
Kawachiya, et al., "Accelerating Java Locks by Utilizing Their Thread Locality", vol. 44, No. SIG 15 (PRO19), Nov. 2003, pp. 13-23. (English Abstract Included).
Intel, "Intel 64 and IA-32 Architectures Software Developer's Manual", vol. 1: Basic Architecture, Order No. 253665-040US, Oct. 2011, 548 pages.
Intel, "Intel 64 and IA-32 Architectures Software Developer's Manual", vol. 2 (2A, 2B & 2C): Instruction Set Reference, A-Z, Order No. 325383-040US, Oct. 2011, 1721 pages.
Intel, "Intel 64 and IA-32 Architectures Software Developer's Manual", vol. 3 (3A, 3B & 3C): System Programming Guide, Order No. 325384-040US, Oct. 2011, 1916 pages.
Notice of Allowance received for United Kingdom Application No. 1402964.9, dated Jun. 22, 2017, 2 pages.
Notice of Allowance received for United Kingdom Patent Application No. 1709375.8, dated Oct. 20, 2017, 2 pages.
Office Action received for United Kingdom Patent Application No. 1709375.8, dated Aug. 15, 2017, 1 page.
Office Action received for Chinese Patent Application No. 201410097357.6, dated Nov. 30, 2016, 25 pages of Chinese Office Action including 14 pages of English Translation.
Notice of Allowance received for Korean Patent Application No. 10-2014-0029403, dated Nov. 4, 2015, 2 pages of Notice of Allowance only.
Office Action received for Korean Patent Application No. 10-2014-0029403, dated May 27, 2015, 4 pages of English Translation and 5 pages of Korean Office Action.
Notice of Allowance received for U.S. Appl. No. 13/844,729, dated Sep. 14, 2015, 7 pages.
Non-Final Office Action received for U.S. Appl. No. 13/844,729, dated Jan. 6, 2015, 12 Pages.
Combined Search and Examination Report received for United Kingdom Patent Application No. 1402964.9, dated Jul. 25, 2014, 6 Pages.
Examination Report received for United Kingdom Application No. GB1402964.9, dated Nov. 4, 2015, 3 pages.
Office Action received for Japanese Patent Application No. 2014-028277, dated Feb. 17, 2015, 12 pages of English Translation and 1 page of Japanese Office Action.
Office Action received for Japanese Patent Application No. 2014-028277, dated Sep. 15, 2015, 9 pages of English Translation and 6 page of Japanese Office Action.
Martinez, et al., "Speculative Synchronization: Applying Thread-Level Speculation to Explicitly Parallel Applications" Proceedings of the 10th International Conference on Architectural Support for Programming Languages and Operating Systems, Oct. 2002, 12 Pages.

\* cited by examiner

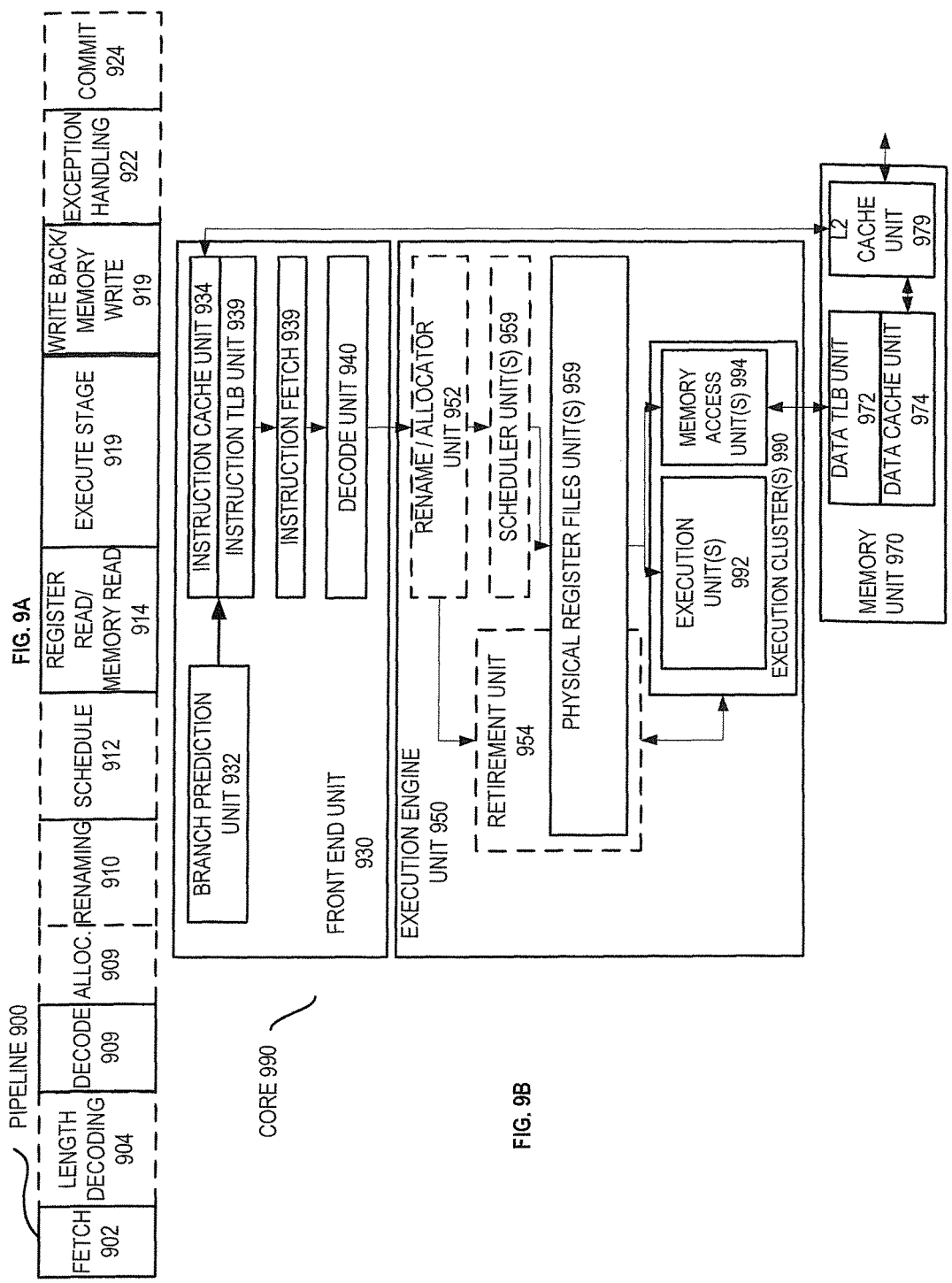

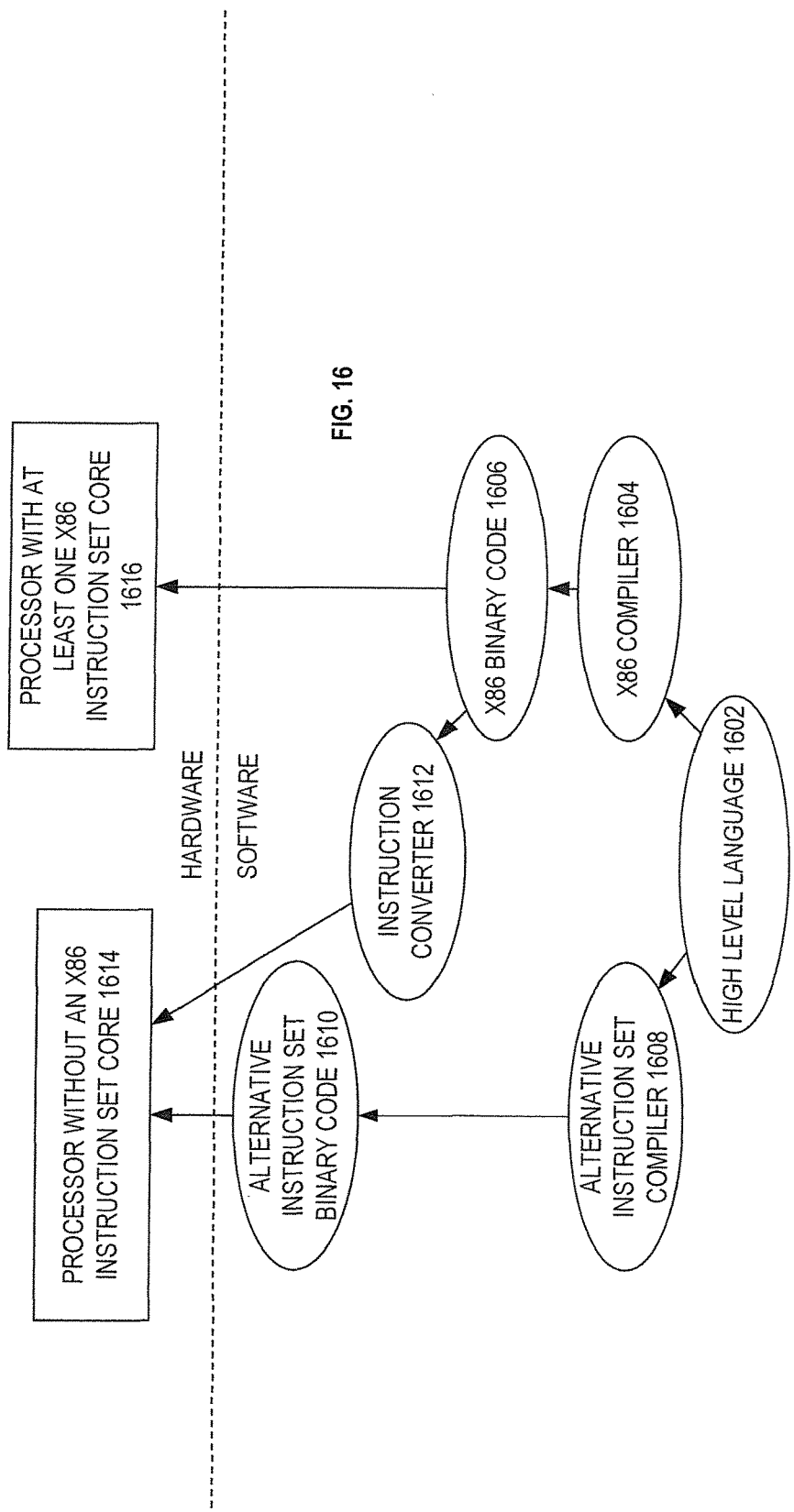

PROCESSORS, METHODS, AND SYSTEMS TO RELAX SYNCHRONIZATION OF ACCESSES TO SHARED MEMORY

RELATED APPLICATIONS

The present application is a continuation of U.S. patent application Ser. No. 13/844,729, filed on Mar. 15, 2013, entitled "PROCESSORS, METHODS, AND SYSTEMS TO RELAX SYNCHRONIZATION OF ACCESSES TO SHARED MEMORY", which is hereby incorporated herein by this reference in its entirety and for all purposes.

BACKGROUND

Technical Field

Embodiments described herein generally relate to processors. In particular, embodiments described herein generally relate to memory access synchronization in processors.

Background Information

Multithreaded software, and other software executed in environments where multiple entities may potentially access the same shared memory, typically includes one or more types of memory access synchronization instructions. Various such instructions are known in the arts. Examples include memory access fence or barrier instructions, lock instructions, conditional memory access instructions, and the like. These memory access synchronization instructions are generally needed in order to help ensure that accesses to the shared memory occur in the appropriate order (e.g., occur consistently with the original program order) and thereby help to prevent erroneous results.

BRIEF DESCRIPTION OF THE DRAWINGS

The invention may best be understood by referring to the following description and accompanying drawings that are used to illustrate embodiments of the invention. In the drawings:

FIG. 9A is a block diagram illustrating both an exemplary in-order pipeline and an exemplary register renaming, out-of-order issue/execution pipeline according to embodiments of the invention.

FIG. 9B is a block diagram illustrating both an exemplary embodiment of an in-order architecture core and an exemplary register renaming, out-of-order issue/execution architecture core to be included in a processor according to embodiments of the invention.

FIG. 16 is a block diagram contrasting the use of a software instruction converter to convert binary instructions in a source instruction set to binary instructions in a target instruction set according to embodiments of the invention.

DETAILED DESCRIPTION OF EMBODIMENTS

In the following description, numerous specific details are set forth (e.g., specific memory synchronization instructions, approaches for relaxing memory synchronization, logic implementations, microarchitectural details, sequences of operations, logic partitioning/integration details, types and interrelationships of system components, and the like). However, it is understood that embodiments of the invention may be practiced without these specific details. In other instances, well-known circuits, structures and techniques have not been shown in detail in order not to obscure the understanding of this description.

Figure 1:
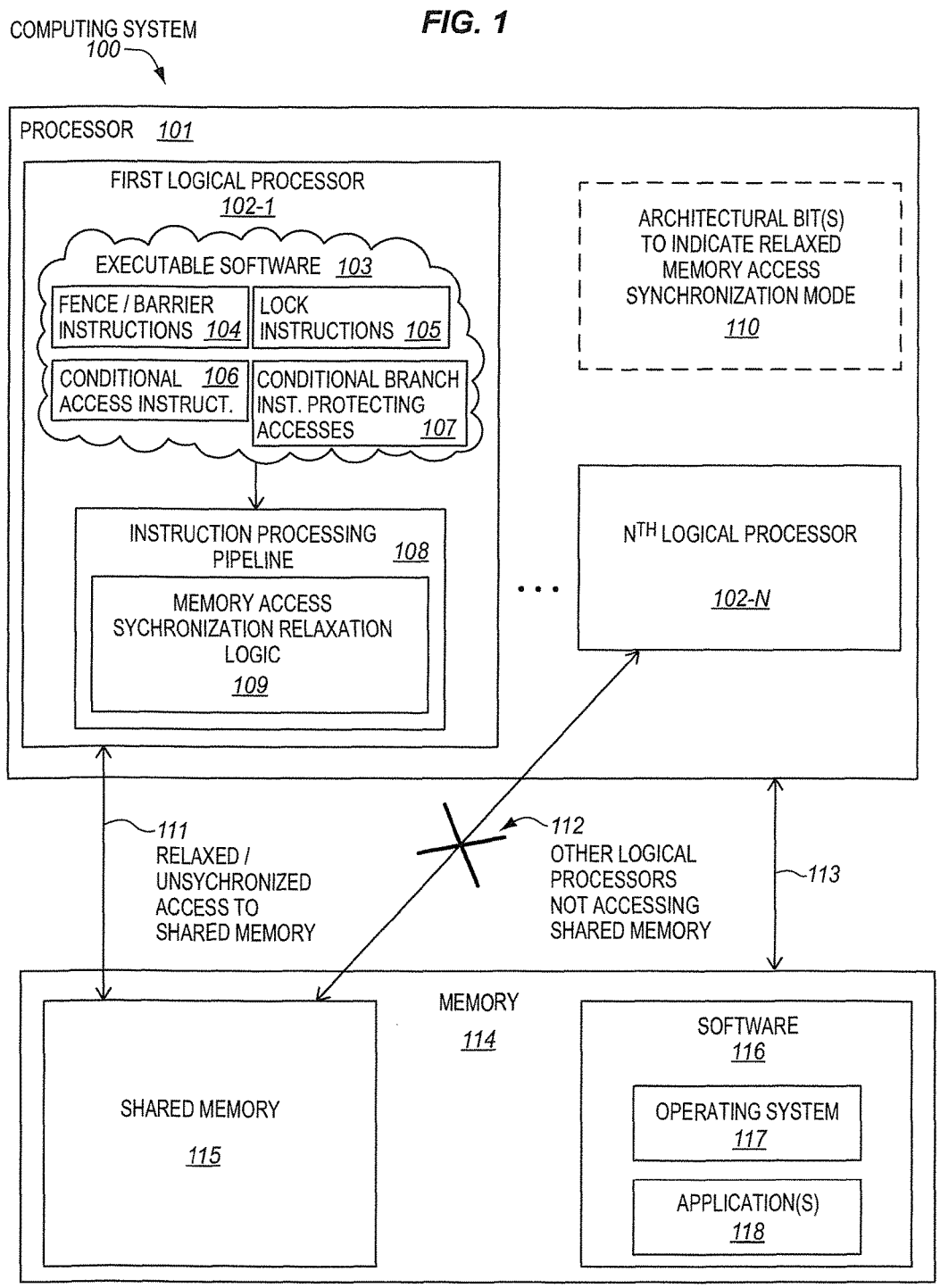
FIG. 1 is a block diagram of an embodiment of a computing system.

FIG. 1 is a block diagram of an embodiment of a computing system 100 that includes a processor 101 and a memory 114. In various embodiments, the computing system may represent a desktop computer, laptop computer, notebook computer, tablet computer, netbook, smartphone, personal digital assistant, cellular phone, server, network device (e.g., router or switch), Mobile Internet device (MID), media player, smart television, set-top box, video game controller, or other electronic device having at least one processor and at least one memory. The memory 114 may include one or more memory devices of either the same or different types. The processor and the memory are coupled, or otherwise in communication with one another, by a conventional coupling mechanism 113 (e.g., through one or more of interconnects, buses, hubs, memory controllers, chipset components, and the like). Any conventional coupling mechanism known in the arts is generally suitable.

In some embodiments, the processor may be a general-purpose processor. For example, the processor may be a general-purpose processor commonly deployed as a central processing unit (CPU) in computer systems. In other embodiments, the processor may be a special-purpose processor. Examples of suitable special-purpose processors include, but are not limited to, communications processors, network processors, cryptographic processors, graphics processors, co-processors, embedded processors, and digital signal processors (DSPs), to name just a few examples. The processor may be any of various complex instruction set computing (CISC) processors, various reduced instruction set computing (RISC) processors, various very long instruction word (VLIW) processors, various hybrids thereof, or other types of processors entirely.

The processor 101 may include any desired number of cores, hardware threads, hardware thread units, hardware thread slots, hardware execution contexts, or other processing elements or logical processors. The term core often refers to logic located on an integrated circuit that is capable of maintaining an independent architectural state (e.g., an execution state), in which the independently maintained architectural state is associated with dedicated execution resources. In contrast, the term hardware thread often refers to logic located on an integrated circuit that is capable of maintaining an independent architectural state, in which the independently maintained architectural state shares access to the execution resources it uses. When certain resources are shared by an architectural state, and others are dedicated to the architectural state, the line between a core and a hardware thread is less distinct. Nevertheless, the core and the hardware thread are often viewed by an operating system as individual processing elements or logical processors. The operating system is generally able to individually schedule threads or processes on each of the cores, hardware threads, hardware thread units, hardware thread slots, hardware execution contexts, or other processing elements or logical processors. In other words, a processing element or logical processor, in one embodiment, may represent any on-die processor logic capable of being independently associated with code, such as a software thread, operating system, application, or other code. In some embodiments, a processing element or logical processor may broadly represent logic that is capable of holding state and being independently associated with code.

In the illustrated embodiment, the processor includes a first logical processor 102-1 through an Nth logical processor 102-N. The number N may be any number appropriate for the particular implementation. By way of example, the number N may commonly range from two to on the order of many hundreds or even thousands in the case of graphics processors and chip multiprocessors. The first logical processor 102-1 includes an instruction processing pipeline 108. The instruction processing pipeline may include generally conventional instruction processing pipeline logic, such as, for example, instruction fetch logic, instruction decode logic, instruction execution logic, and the like. Each of the other logical processors may also include an instruction processing pipeline, which for simplicity is not shown. Each of the cores or other logical processors may be either single threaded or multi-threaded. In various embodiments, the cores or other logical processors may be symmetric cores, asymmetric cores (e.g., heterogeneous cores having different hardware resources or even different instruction sets), or some may be symmetric while others may be asymmetric.

The memory 114 has software 116 stored therein. The software may include, for example, one or more operating systems (OS) 117 and one or more applications 118. During operation, a portion of the software may be loaded into the processor 101 and may be run or executed by the processor. By way of example, different processes or threads may be scheduled on the different logical processors 102. As shown, the first logical processor 102-1 may have executable software 103. Similarly, at least some of the time, the other logical processors may also have executable software (not shown). The executable software may include instructions of an instruction set architecture (ISA) of the logical processor. These ISA instructions are sometimes referred to as macroinstructions, machine level instructions, or assembly language instructions. The executable software may include one or more memory access instructions 119 to access the memory 114. For example, the executable software may include one or more load/read instructions to load/read data from the shared memory and/or one or more store/write instructions to store/write data to the shared memory. These instructions come in different flavors and are known by different names. Examples of these instructions include, but are not limited to, move instructions, load/move and duplicate instructions, load multiple instructions, store multiple instructions, gather instructions, scatter instructions, etc.

At least some of the time, the other logical processors (e.g., the Nth logical processor 102-N) may also have executable software loaded and running thereon (not shown). This executable software may similarly have one or more memory access instructions used to access the memory 114. At least some of the time, a shared memory 115 (e.g., a portion of the memory 114) may be shared by at least two of the logical processors. When two or more logical processors are accessing the shared memory, it is generally appropriate at appropriate locations in the executable software to synchronize the memory accesses so that they occur in the appropriate order (e.g., occur consistently with the original program order). In some cases, one or more of the logical processors may execute instructions out of order. Potentially, the different logical processors may operate at different frequencies or other rates. In some embodiments, one or more external devices not located on the processor 101 (e.g., not located on the same die or chip), such as, for example, one or more coprocessors, input/output (I/O) devices, or other devices in the system, may also potentially access the shared memory. Even if the processor has a relatively strong memory ordering model and is able to account for memory accesses without explicit synchronization primitives among the logical processors, synchronization is often appropriate when there is the possibility of such external device(s).

If appropriate synchronization mechanisms are not used, the memory accesses to the shared memory 115 could occur in a different order than intended (e.g., not consistent with original program order), which could lead to computationally incorrect results. Consider a simple example where a program intends the first logical processor to read a value "A" at a given storage location, add the value "A" to a value "B", write the sum "A+B" back to the given storage location, and then the Nth logical processor read the sum "A+B" from the given storage location. In this example, if instead the Nth logical processor, for whatever reason, reads the value "A" from the given storage location before the sum "A+B" was written to it; this could lead to a computationally incorrect result. To help prevent such occurrences, multi-threaded software and other software executed in environments where multiple entities may potentially access the same shared memory include a memory access synchronization mechanism (e.g., one or more memory access synchronization instructions).

Referring again to FIG. 1, the executable software 103 includes various examples of possible types of memory access synchronization instructions. In the illustrated embodiment, these include one or more memory access fence and/or memory access barrier instructions 104, one or more memory lock instructions 105, one or more conditional memory access instructions 106, and one or more conditional branch instructions 107 to conditionally protect a memory access (e.g., conditionally jump over or not jump over the memory access). Many different examples of these and other types of memory access synchronization instructions and mechanisms have been developed.

The fence and/or barrier instructions commonly cause the processor to enforce a memory access ordering constraint. For example, a fence instruction may guarantee that certain memory access operations of a given type that occur in program order before the fence instruction are performed before memory access operations of the given in program order after the fence/barrier instructions. By way of example, Intel IA-32 architecture includes an SFENCE (store fence) instruction to serialize store operations (e.g., stores in program order before the SFENCE instruction are guaranteed to be performed before stores after the SFENCE instruction), an LFENCE (load fence) instruction to serialize load operations (e.g., loads in program order before the LFENCE instruction are guaranteed to be performed before loads after the LFENCE instruction), and an MFENCE (memory fence) instruction to serialize load and store operations (e.g., both loads and stores in program order before the MFENCE instruction are guaranteed to be performed before loads and stores after the MFENCE instruction).

In addition, the OMAP™ 3 and other multimedia applications processors from Texas Instruments (TI) execute Data Memory Barrier (DMB), Data Synchronization Barrier (DSB), and Instruction Synchronization Barrier (ISB) type instructions. The DMB instructions ensure that all explicit data memory transfers before the DMB are completed before any subsequent data memory transfers after the DMB starts. The DSB instructions ensure that all explicit data memory transfer before the DSB are complete before any instruction after the DSB is executed. The ISB instructions ensure that the effects of all context altering operations prior to the ISB are recognized by subsequent instructions. In addition, processors from TI execute load-link and store-conditional (LL/SC) pair of instructions. The load-link instruction may be used to read a current value of a memory location. The store-conditional instruction, which follows the load-link instruction, may store a new value to that memory location if no changes have been made to that memory location since the load-link instruction. These and other architectures generally also have variations of one or more of atomic read-modify-write instructions, compare-and-swap instructions, compare-and-swap double instructions, compare-and-exchange instructions, test-and-set instructions, compare-and-set instructions, fetch-and-add instructions, and the like. By way of example, a read-modify-write instruction may read a memory location and write a new value to it (e.g., either a new value or a function or derivation of the read value). By way of example, a compare-and-swap atomic instruction may atomically compare the contents of a memory location to a given value and if they are the same modify the contents of that memory location to a given new value.

These memory access synchronization instructions/mechanisms are generally regarded as needed in order to help ensure proper memory access ordering and prevent incorrect results. However, they generally represent an overhead or tax that tends to reduce performance. On the one hand, it takes a certain amount of time (e.g., clock cycles), pipeline resources, and power to execute these instructions. In addition, some of these instructions may force serialization, which may tend to limit the extent to which instructions may be reordered and executed out of order, which may tend to limit the benefits of out of order execution. Such a tax or overhead may be especially observed in processors that have weak or relatively weak memory ordering models, since the memory access synchronization instructions generally need to be employed more liberally in order to help ensure proper memory access ordering. Accordingly, especially in the case of processors with weak memory access ordering models, such memory access synchronization instructions may tend to reduce performance and/or increase power consumption.

In some embodiments, a memory access synchronization mechanism may be selectively relaxed (e.g., the amount of synchronization may be reduced) when appropriate in order to help increase performance and/or reduce power consumption. For example, in some embodiments, such relaxation of the memory synchronization with respect to the shared memory 115 may be appropriate when only one logical processor (e.g., the first logical processor 102-1) is accessing the shared memory 114. The logical processor may selectively use the synchronization mechanism when one or more other entities in the system are able to potentially observe, and needs to be synchronized with, the accesses to the shared memory. For example, if only a single thread is running in the system, the logical processor on which that thread is running will typically natively ensure that that single thread sees a correct view of the shared memory, and accordingly that single thread need not incur the performance and power tax of enforcing the memory access synchronization. Rather, the processor may operate in a relaxed synchronization mode to help improve performance and/or reduce power consumption. For example, when in the relaxed synchronization mode, instructions may be reordered relative to the memory access synchronization instructions in ways that the memory access synchronization instructions would not otherwise ordinarily permit.

Referring again to FIG. 1, the processor 101 includes memory access synchronization relaxation logic 109. The logic 109 is operable, when appropriate, to relax synchronization of accesses to the shared memory 115. For example, in some embodiments, the logic 109 may prevent a memory access synchronization instruction (e.g., one or more of the fence/barrier instructions 104, the lock instruction 105, the conditional access instruction 106, etc.) from synchronizing accesses to the memory when the processor is in a relaxed memory access synchronization mode. At other times, the processor may abstain from relaxing the synchronization of the accesses to the shared memory (e.g., may treat the memory access synchronization instructions/mechanisms in a substantially conventional manner). In some embodiments, the processor 101 may optionally have an architectural relaxed synchronization mode. In some embodiments, the processor may have one or more architectural bits 110 to indicate the architectural relaxed memory access synchronization mode. The memory access synchronization logic 109 may selectively relax the synchronization of the accesses to the shared memory when the one or more architectural bits 110 indicate the architectural relaxed synchronized mode. As shown, in some embodiments, when the processor is in the relaxed synchronization mode, the first logical processor (e.g., a thread running thereon) may perform relaxed (e.g., at least partially unsynchronized) accesses 111 to the shared memory 115. In some embodiments, other logical processors may not be accessing 112 the shared memory 115 when the processor is in the relaxed synchronization mode.

In some embodiments, relaxing the synchronization of the accesses may include ignoring memory access synchronization instructions/mechanisms (e.g., fence instructions, barrier instructions, lock instructions, etc.). In some embodiments, relaxing the synchronization of the accesses may include converting memory access synchronization instructions/mechanisms to corresponding/analogous non-synchronization memory access instructions/mechanisms (e.g., a conditional memory access instruction may be converted to an un-conditional memory access instruction). In some embodiments, relaxing the synchronization of the accesses may include predicting conditional branch instructions to branch or jump in a particular appropriate way relative to memory access instructions (e.g., predict as if synchronization does not need to be enforced and/or as if there no possibility of a shared data conflict).

In some embodiments, the one or more architectural bits 110 may be architecturally-visible and/or visible to operating system or other software. The bits may be capable of being configured to indicate whether or not the processor, or the first logical processor, is in the architectural relaxed synchronization mode. For example, in one embodiment, the bit(s) may have a first value (e.g., a single architecturally-visible relaxed synchronization mode bit may be set to binary one) to indicate that the processor is in the relaxed synchronization mode, or the bit(s) may have a second different value (e.g., the single bit may be cleared to binary zero) to indicate that the processor is not in the relaxed synchronization mode. In other embodiments, there may be more than one architectural bit (e.g., different architectural bits for different corresponding shared memory portions, different architectural bits for different logical processors or threads, etc.). By way of example, these bits may be included in an architecturally-visible or architectural register (e.g., a page table base register, another control or configuration register, etc.).

An appropriate entity in the system, such as, for example, the operating system, an application software, or software, may configure these bits as appropriate depending upon the particular activities and what threads are running and what memory is being shared in the system. For example, the operating system may determine to enter the architectural relaxed synchronization mode after determining that a single thread is running in the system, determining that only one thread will access a particular shared memory, determining that no other thread is observing the shared memory or the running thread, determining that the synchronization instructions/mechanisms aren't needed, or otherwise determining that it is appropriate or permissible to enter the architectural relaxed synchronization mode.

To avoid obscuring the description, a relatively simple processor 101 has been shown and described. In other embodiments, the processor may optionally include other well-known components, such as, for example, an instruction fetch unit, an instruction scheduling unit, a branch prediction unit, instruction and data caches, instruction and data translation lookaside buffers, prefetch buffers, micro-instruction queues, microinstruction sequencers, bus interface units, second or higher level caches, a retirement unit, a register renaming unit, other conventional components, and various combinations thereof. There are literally numerous different combinations and configurations of components in processors, and embodiments are not limited to any particular combination or configuration. The processor may represent an integrated circuit or set of one or more semiconductor dies or chips (e.g., a single die or chip, or a package incorporating two or more die or chips). In some embodiments, the processor may represent a system-on-chip (SoC) and/or a chip multi-processor (CMP).

Figure 2:
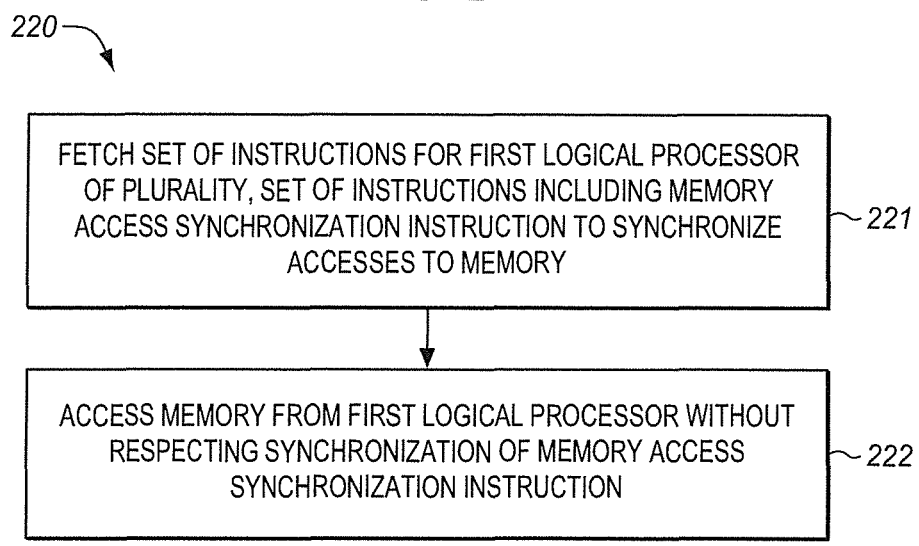
FIG. 2 is a block flow diagram of an embodiment of a method of relaxing synchronization of accesses to shared memory.

FIG. 2 is a block flow diagram of an embodiment of a method 220 of relaxing synchronization of accesses to shared memory. In some embodiments, the operations and/or method of FIG. 2 may be performed by and/or within the apparatus of FIG. 1. The components, features, and specific optional details described herein for the apparatus also optionally apply to the operations and/or method, which may in embodiments be performed by and/or within the apparatus. Alternatively, the operations and/or method of FIG. 2 may be performed by and/or within a similar or entirely different apparatus. Moreover, the apparatus of FIG. 1 may perform operations and/or methods the same as, similar to, or entirely different than those of FIG. 2.

The method includes fetching a set of instructions for a first logical processor, at block 221. The logical processor may be one of a plurality of logical processors of a processor. In some embodiments, the set of instructions may include at least one memory access synchronization instruction to synchronize accesses to a memory. In various embodiments, the memory access synchronization instruction may include a fence instruction, a barrier instruction, a lock instruction, a conditional memory access instruction, or a conditional branch instruction used for branching with respect to memory accesses.

The method includes accessing the memory from the first logical processor without respecting the synchronization of the memory access synchronization instruction, at block 222. In some embodiments, the first logical processor may ignore, not pay attention to, not respect, not observe, filter out, prevent, block, stop, or otherwise not respect the synchronization associated with the memory access synchronization instruction. For example, in some embodiments, the memory access synchronization instruction may be decoded or otherwise converted to a no operation (NOP). As another example, in some embodiments, the memory access synchronization instruction may be decoded or otherwise converted to an un-synchronized instruction. As another example, in some embodiments, logic of the processor may ignore or filter out the memory access synchronization instruction so that it does not affect memory access synchronization. Advantageously, allowing the logical processor to operate without respecting the memory access synchronization instruction may help to improve performance and/or reduce power consumption.

As mentioned above, in some embodiments, relaxing the synchronization of the accesses may include ignoring memory access synchronization instructions (e.g., fence instructions, barrier instructions, lock instructions, etc.). There are different microarchitectural ways that the processor may use to ignore these synchronization instructions.

Figure 3:
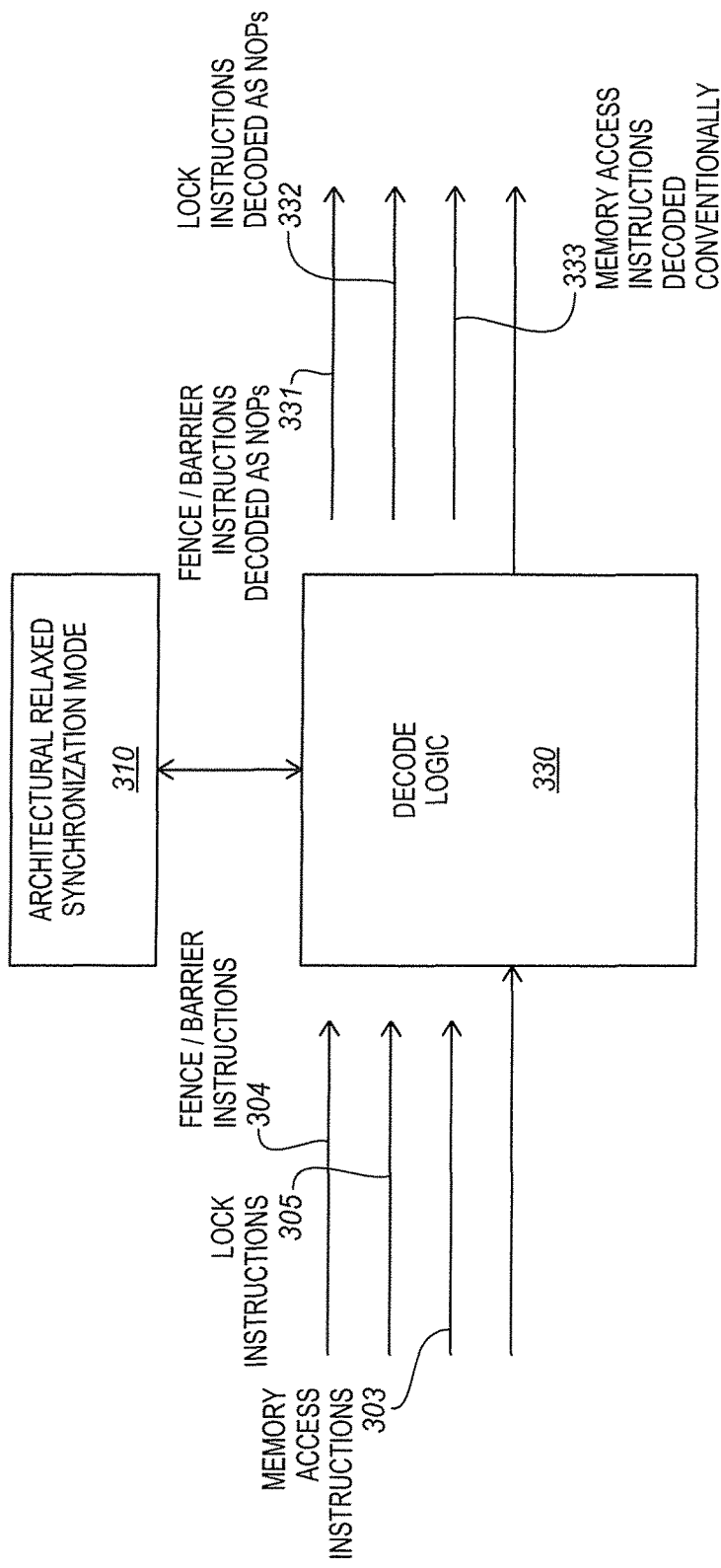
FIG. 3 is a block diagram of an embodiment of a decode logic that is operable to decode memory access synchronization instructions into no operations (NOPs) when in a relaxed synchronization mode.

FIG. 3 is a block diagram of an embodiment of a decode logic 330 that is operable, when the processor is in a relaxed synchronization mode, to decode certain types of memory access synchronization instructions into no operations (NOPs). In some embodiments, the decode logic of FIG. 3 may be included in the processor of FIG. 1 and/or may be used in the method of FIG. 2. Alternatively, the decode logic of FIG. 3 may be included in a similar or different processor and/or may be used in similar or different methods. Moreover, the processor of FIG. 1 and/or the method of FIG. 2 may use similar or different logic than that of FIG. 3.

The decode logic may also be referred to as a decode unit or decoder. The decoder may be implemented using various different mechanisms including, but not limited to, microcode read only memories (ROMs), look-up tables, hardware implementations, programmable logic arrays (PLAs), and other mechanisms used to implement decoders known in the art.

During operation, relatively higher-level instructions, such as assembly instructions or macroinstructions, may be provided to the instruction decode logic. By way of example, the instructions may be provided to the decode logic from an instruction fetch unit, an instruction queue, or the like. As shown in the illustration, the instructions may include one or more types of memory access instructions 303 (e.g., load instructions, store instructions, gather instructions, etc.), one or more types of memory fence and/or memory barrier instructions 304, and one or more types of lock instructions 305.

When decoding the memory access instructions 303, as well as when decoding various other instructions not used for memory access synchronization (e.g., conventional arithmetic, logical, and other instructions), the decode logic may operate substantially conventionally, whether or not the processor is in the relaxed synchronization mode. The decode logic may decode these relatively higher-level instructions into one or more corresponding microinstructions, micro-operations, micro-code entry points, or other relatively lower-level (e.g., circuit-level or hardware-level) instructions or control signals that generally implement the operation of the instruction that was decoded.

In contrast, when the processor is in the relaxed synchronization mode, the decode logic may be operable to decode or otherwise convert certain types of memory access synchronization instructions into no operations (NOPs). As shown, in some embodiments, the decode logic may be coupled with and/or aware of relaxed synchronization mode. As previously mentioned, this mode may represent one or more architecturally-visible bits, which may be set or cleared, for example by an operating system or other software, to transition the processor into, and out of, the relaxed synchronization mode. When the processor is not in the relaxed synchronization mode, the decode logic may decode these memory access synchronization instructions substantially conventionally. That is, fence instructions, barrier instructions, lock instructions, and the like, may be decoded into micro-operations, or other instructions or control signals, which proceed through the pipeline and implement the intended fence, barrier, or lock. However, in some embodiments, when the processor is in the relaxed synchronization mode, the decode logic may decode these certain types of memory access synchronization instructions into no operations (NOPs). As shown, in some embodiments, fence and/or barrier instructions may be decoded as NOPs. For example, an MFENCE, SFENCE, or LFENCE macroinstruction may be decoded into NOPs rather than the instructions or control signals that these macroinstructions would conventionally be decoded into. Moreover, in some embodiments, lock instructions may be decoded as NOPs. The NOPs may effectively perform no operation and/or may perform no memory access synchronization. The processor pipeline may essentially silently ignore these NOPs. In this way, the decode logic may selectively filter out the fence, barrier, and lock instructions, or at least a portion thereof, when the processor is in the relaxed synchronization state. Advantageously, this may help to improve performance and/or reduce power consumption.

It is to be appreciated that it is not required that the decode logic decode all fences, barriers, and/or locks into NOPs. Rather, in some embodiments, one or more fence instructions and/or one or more barrier instructions and/or one or more lock instructions may be decoded into NOPs. The level of relaxation of synchronization may be varied from one embodiment to the other to balance the objectives of improving performance and/or reducing power with retaining varying levels of partial synchronization. In some embodiments, one type of instruction (e.g., a type more important to synchronization and/or a type more strongly affecting performance or power) may be decoded as a NOP, but another type may not. For example, one type of fence or barrier (e.g., an LFENCE) may be decoded as a NOP, whereas another type (e.g., an MFENCE) may not. As another example, in some cases fences or barriers but not locks may be decoded as NOPs, or the reverse. The level of relaxation of synchronization is therefore flexible and may be varied to suit the particular objectives of the implementation.

In other embodiments, rather than the decoder converting the memory access synchronization instructions to NOPs, other instruction conversion logic may be used to convert these instructions to NOPs. Examples of suitable instruction conversion logic include, but are not limited to, instruction emulation logic, instruction translation logic, instruction morph logic, instruction interpretation logic, and combinations thereof.

Figure 4:
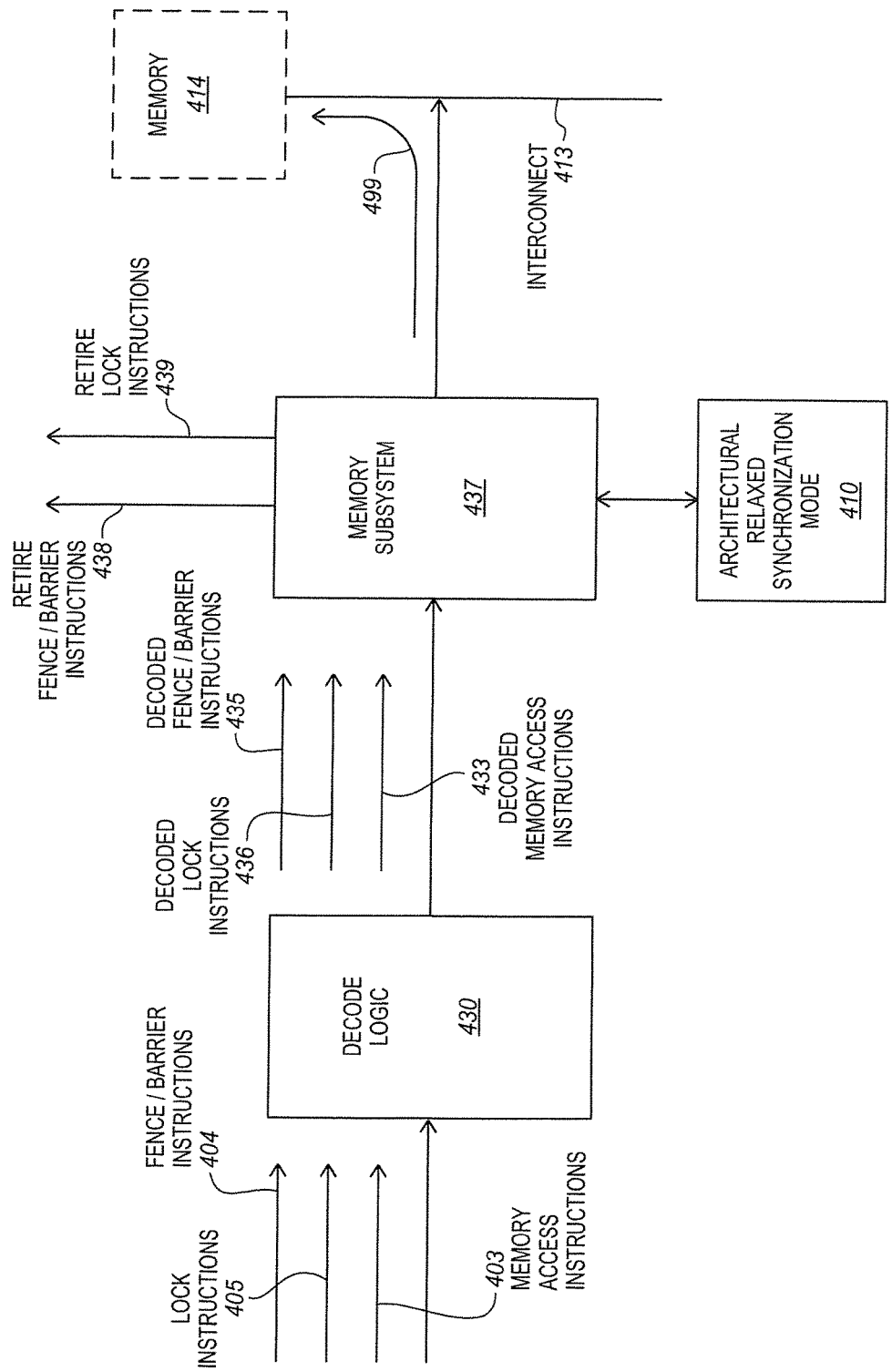
FIG. 4 is a block diagram of an embodiment of a memory subsystem that is operable to retire memory access synchronization instructions so that they do not effect memory access synchronization when in a relaxed synchronization mode.

FIG. 4 is a block diagram of an embodiment of a memory subsystem 437 that is operable, when the processor is in a relaxed synchronization mode, to retire certain types of memory access synchronization instructions in a way that they do not effect memory access synchronization. In some embodiments, the memory subsystem of FIG. 4 may be included in the processor of FIG. 1 and/or may be used in the method of FIG. 2. Alternatively, the memory subsystem of FIG. 4 may be included in a similar or different processor and/or may be used in a similar or different method. Moreover, the processor of FIG. 1 and/or the method of FIG. 2 may use a similar or different memory subsystem than that of FIG. 4.

As before, decode logic 430 may receive relatively higher-level instructions, such as assembly instructions or macroinstructions, may be provided to the instruction decode logic. These instructions may include one or more types of memory access instructions 403 (e.g., load instructions, store instructions, gather instructions, etc.), one or more types of memory fence and/or memory barrier instructions 404, and one or more types of lock instructions 405. In some embodiments, the decode logic may decode each of these instructions substantially conventionally whether or not the processor is in the relaxed synchronization mode.

The memory subsystem 437 may receive the corresponding decoded instructions or control signals. As shown, in some embodiments, the memory subsystem may be coupled with and/or aware of whether or not the processor is in an optionally architectural relaxed synchronization mode 410. When processing the decoded memory access synchronization instructions or control signals, the memory subsystem may check to see whether the processor is in the relaxed synchronization mode (e.g., check one or more architectural bits). When the processor is not in the relaxed synchronization mode, the memory subsystem may process these decoded memory access synchronization instructions or control signals substantially conventionally which in some cases may help to implement or enforce memory access synchronization. For example, a control signal decoded from an LFENCE instruction may cause the memory subsystem to fence loads.

However, in some embodiments, when the processor is in the relaxed synchronization mode, the memory subsystem may handle these decoded memory access synchronization instructions or control signals differently and in a way that relaxes the memory access synchronization. The particular way in which this is done will generally depend upon the particular microarchitectural approach used to implement the synchronization. Those skilled in the art and having the benefit of the present disclosure will appreciate that the scope of the invention is not limited to any particular approach. As one particular example, the memory subsystem may retire, terminate, or discard these decoded memory access synchronization instructions or control signals without allowing them to perform memory access synchronization. As shown, in some embodiments, one or more fence and/or barrier instructions may be retired 438 from the memory subsystem. Moreover, in some embodiments, one or more lock instructions may be retired 439 from the memory subsystem. In some embodiments, the memory subsystem may effectively treat these decoded memory access synchronization instructions as NOPs. In some embodiments, the memory subsystem may effectively selectively filter out these decoded memory access synchronization instructions when the processor is in the relaxed synchronization mode. The decoded memory access instructions or control signals may appear as signals or cycles 499 on interconnect 413 leading to the memory 414, and may or may not be synchronized, depending upon whether the processor is or is not in the relaxed synchronization mode.

As before, it is not required that all fences/barriers and/or locks be handled in a relaxed way. Rather, in some embodiments, at least some memory access synchronization instructions (e.g., at least one type) may be handled with relaxed synchronization. The level of relaxation of synchronization is flexible and may be varied from one embodiment to the other to balance the objectives of improving performance and/or reducing power with retaining varying levels of partial synchronization.

As mentioned above, in some embodiments, relaxing the synchronization of the memory accesses may include converting a synchronization memory access instruction (or set of instructions) to a corresponding and/or analogous non-synchronization memory access instruction (or set of instructions). For example, a conditional memory access instruction may be converted to a corresponding/analogous un-conditional memory access instruction.

Figure 5:
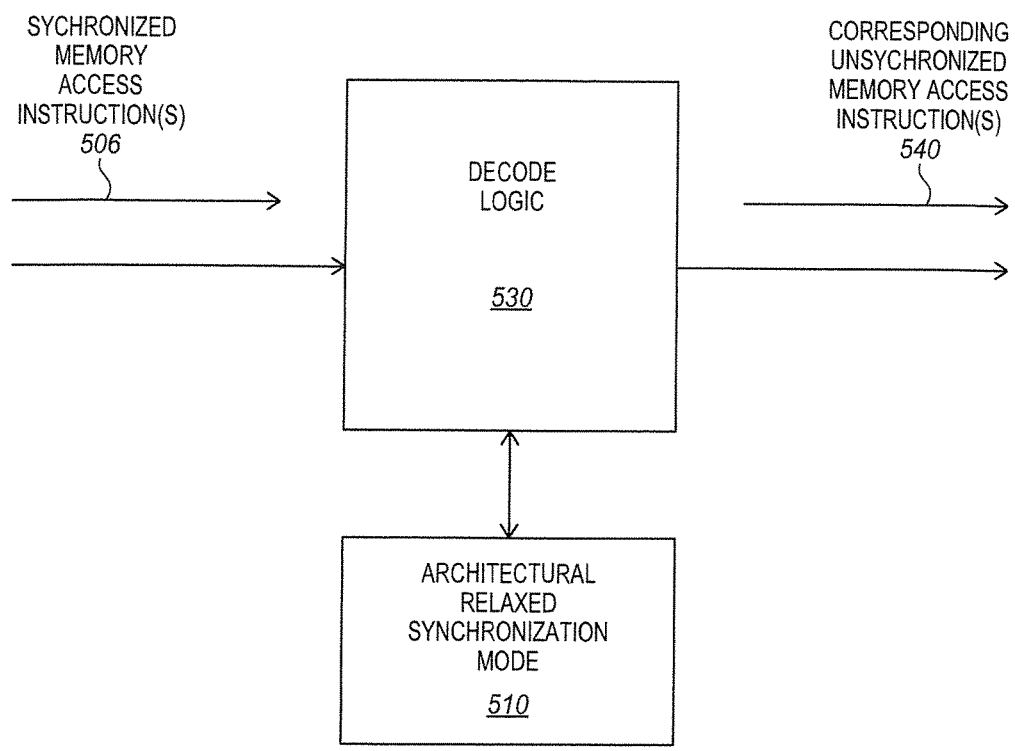
FIG. 5 is a block diagram of an embodiment of a decode logic that is operable to convert one or more synchronization memory access instructions to one or more corresponding non-synchronization memory access instructions when in a relaxed synchronization mode.

FIG. 5 is a block diagram of an embodiment of a decode logic 530 that is operable, when the processor is in a relaxed synchronization mode, to decode or otherwise convert a synchronization memory access instruction (or set of instructions) to a corresponding and/or analogous non-synchronization memory access instruction (or set of instructions). In some embodiments, the decode logic of FIG. 5 may be included in the processor of FIG. 1 and/or may be used in the method of FIG. 2. Alternatively, the decode logic of FIG. 5 may be included in a similar or different processor and/or may be used in a similar or different method. Moreover, the processor of FIG. 1 and/or the method of FIG. 2 may use similar or different logic than that of FIG. 5.

The decoder may receive a synchronized memory access instruction (or set of instructions). As shown, in some embodiments, the decode logic may be coupled with and/or aware of relaxed synchronization mode. In some embodiments, the synchronized memory access instruction may represent a conditional memory access instruction, such as, for example, a conditional load, a conditional store, or the like. In other embodiments, the synchronized memory access set of instructions may represent a load-link and store-conditional (LL/SC) pair of instructions. The load-link and store-conditional (LL/SC) pair of instructions are used in some multithreaded architectures to achieve synchronization. The load-link instruction may be used to read a current value of a memory location. The store-conditional instruction, which follows the load-link instruction, may store a new value to that memory location if no changes have been made to that memory location since the load-link instruction. Other embodiments pertain to other lock-free atomic read-modify-write instructions/operations. In other embodiments, the synchronized memory access set of instructions may represent a transactional synchronization extension (TSX) or transactional memory support instruction. Still other examples of suitable instructions include compare-and-swap instructions, double compare-and-swap instructions, N compare-and-swap instructions, and the like.

When the processor is not in the relaxed synchronization mode, the decode logic may decode the synchronized memory access instruction (or set of instructions) substantially conventionally. However, in some embodiments, when the processor is in the relaxed synchronization mode, the decode logic may decode or otherwise convert the synchronized memory access instruction (or set of instructions) to a corresponding and/or analogous non-synchronization memory access instruction (or set of instructions). For example, in one embodiment, a conditional memory access instruction (e.g., a conditional load or a conditional store) may be converted to a corresponding/analogous un-conditional memory access (e.g., an un-conditional load or an un-conditional store) instruction or control signal. As another example, a lock move register instruction may be converted to a move register instruction. As another example, in one embodiment, a load-link and store-conditional (LL/SC) pair of instructions may be converted to a single un-conditional store instruction or control signal. In one aspect, this may represent a macro-fusion type conversion. In yet another embodiment, a read-modify-write operation may be converted to a simpler write instruction or control signal. Advantageously, more complicated synchronization instructions may be converted into simpler non-synchronization instructions or control signals.

As before, it is not required that all synchronization memory access instructions (or sets of instructions) be converted to corresponding and/or analogous non-synchronization memory access instructions (or sets of instructions), but rather at least one may be converted. The level of relaxation is flexible and may be customized to the particular implementation. It is also to be appreciated that in other embodiments, rather than the decoder converting, other instruction conversion logic may be used to convert these instructions. Examples of suitable instruction conversion logic include, but are not limited to, instruction emulation logic, instruction translation logic, instruction morph logic, instruction interpretation logic, and combinations thereof.

Code often includes one or more different types of conditional branch instructions. The conditional branch instructions may cause the control flow of execution to branch conditionally in one of two possible directions. These two directions are often called a "taken path" and a "not taken path". The "not taken path" commonly leads to the next sequential instruction in the code being executed, whereas the "taken path" commonly jumps or branches over one or more intervening instructions to a non-sequential branch target instruction. Whether the branch instruction is taken or not taken generally depends upon the evaluation of conditions associated with the instruction (e.g., whether or not the conditions are met).

Intel Architecture includes a number of suitable examples of conditional jump instructions. A few representative examples of suitable "jump if condition is met" (jcc) instructions include, but are not limited to: (a) a jump short if above (carry flag=0 and zero flag=0) instruction (JA); (b) a jump short if carry (carry flag=1) instruction (JC); (c) a jump near if 0 (zero flag=1) instruction (JZ); (d) a jump short if not zero (zero flag=0) instruction (JNZ); (e) a jump near if below or equal (carry flag=1 or zero flag=1) instruction (JBE); and (f) a jump near if not greater (zero flag=1 or sign flag≠OF) instruction (JNG). Other examples are known in other architectures.

To help improve performance, most modern processors have branch predictors to help predict the directions of the conditional branches before the actual directions of the conditional branches have been determined. Generally, the actual directions of the conditional branches are not known definitively until the condition has actually been evaluated at a subsequent stage of the pipeline. However, the branch predictors may employ a branch prediction mechanism or logic to predict the directions of the conditional branches (e.g., based on past history). This may help to improve processor performance. Without the branch predictors, the processor might have to wait for the evaluation of the conditions associated with the conditional branch instructions before it could fetch additional instructions into the pipeline. However, the branch predictor may help to avoid such wasted time by predicting the most likely direction of the conditional branch. The predicted branch direction may then be used to fetch additional instructions and execute them speculatively.

Ultimately the predicted branch direction will turn out either to be correct or incorrect. If the predicted branch direction turns out to be correct, then the results and/or state of the speculatively executed instructions may be utilized. In this case, the performance and speed of the processor will generally have been increased due to greater utilization of pipeline stages that would otherwise have been dormant, or at least underutilized, while waiting for the evaluation of the actual direction of the conditional branch. However, if instead the predicted branch direction turns out to be incorrect (e.g., was miss-predicted by the branch predictor), then any results and/or state from the instructions speculatively executed beyond the conditional branch instruction will typically need to be discarded. Often, the pipeline will be flushed (discarding instructions currently in flight in the pipeline) and the execution will be rewound back to the conditional branch that was miss-predicted and restarted with the alternate now correctly known branch direction. This outcome is generally undesirable, since it tends to incur both a performance penalty and an energy penalty.

Figure 6:
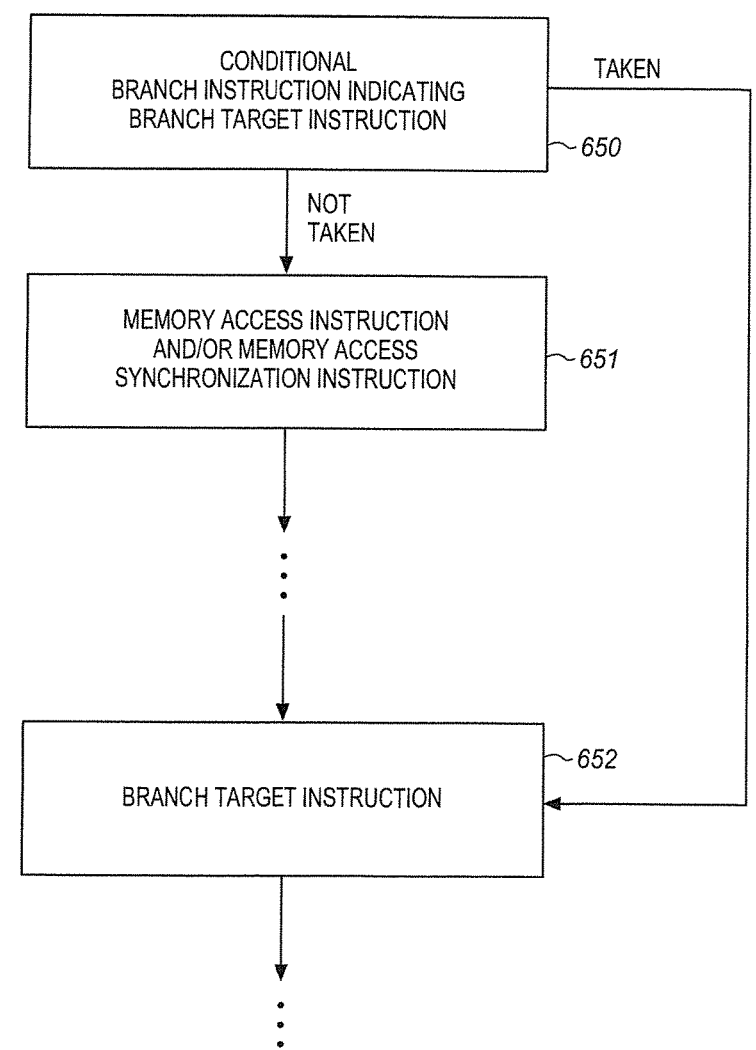
FIG. 6 is a block diagram of an example of code having a conditional branch instruction to conditionally allow or not allow control flow to advance to a memory access instruction and/or a memory access synchronization instruction.

FIG. 6 is a block diagram of an example of code having a conditional branch instruction 650 to conditionally allow or not allow control flow to advance to a memory access instruction and/or a memory access synchronization instruction 651. The conditional branch instruction has a "taken path" and a "not taken path". The taken path leads to a forward branch target instruction 652 that is indicated by the conditional branch instruction. For example, the conditional branch instruction may have an argument or source operand to indicate the branch target instruction (e.g., specify an offset to the branch target instruction). The not taken path leads to a set of one or more instructions that sequentially follow the conditional branch instruction in program order and are between the conditional branch instruction and the branch target instruction. In some embodiments, these may include a memory access instruction and/or a memory access synchronization instruction 651.

Figure 7:
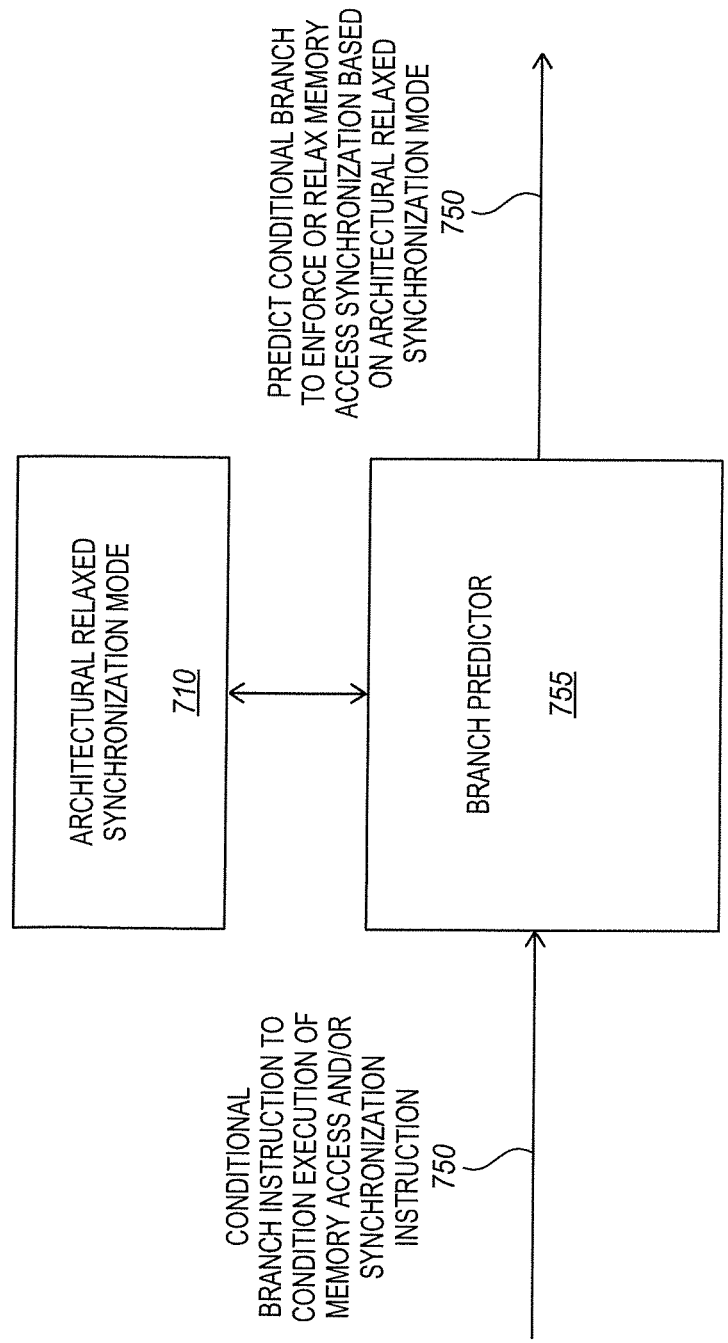
FIG. 7 is a block diagram of an embodiment of a branch predictor that is operable to predict a conditional branch instruction to enforce or relax memory access synchronization based on an architectural relaxed synchronization mode.

FIG. 7 is a block diagram of an embodiment of a branch predictor 755 that is operable to predict a conditional branch instruction to enforce or relax memory access synchronization based on an architectural relaxed synchronization mode 710. The branch predictor may receive a conditional branch instruction. In some embodiments, the conditional branch instruction may be used to conditionally control flow transfer into or away from a memory access instruction and/or a memory access synchronization instruction. The branch predictor is coupled with an architectural relaxed synchronization mode 710. The branch predictor may be operable to predict the conditional branch instruction to be taken or not taken based on the architectural relaxed synchronization mode. In some embodiments, this may be done to enforce or relax memory access synchronization. For example, when in the architectural relaxed synchronization mode, the branch predictor may predict the conditional branch instruction in a way that relaxes memory access synchronization. Alternatively, when not in the architectural relaxed synchronization mode, the branch predictor may predict the conditional branch instruction in a way that enforces memory access synchronization.

Figure 8:
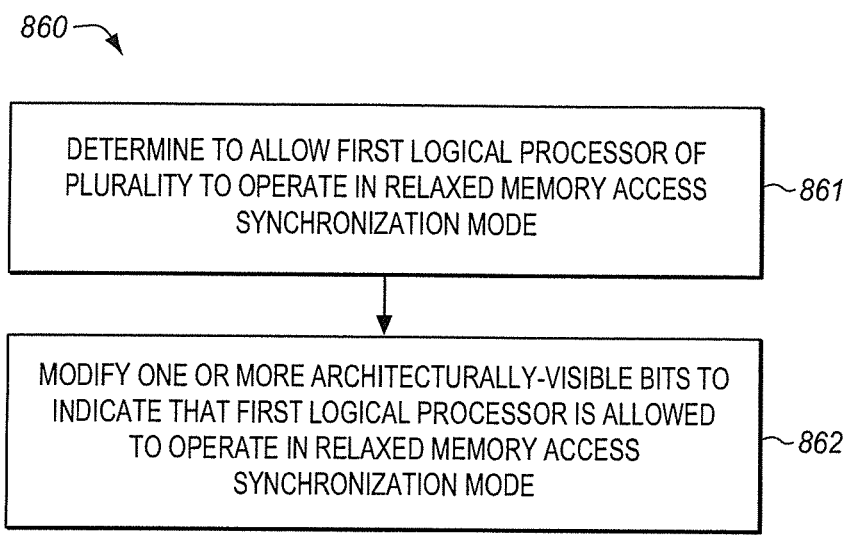
FIG. 8 is a block flow diagram of an embodiment of a method of configuring a processor to use a relaxed memory access synchronization mode.

FIG. 8 is a block flow diagram of an embodiment of a method 860 of configuring a processor to use a relaxed memory access synchronization mode. In some embodiments, the method 860 may be performed by instructions and/or modules of an operating system, application, or other software running on a processor. In some embodiments, the operations and/or method of FIG. 8 may be performed by and/or within the apparatus of FIG. 1. The components, features, and specific optional details described herein for the apparatus also optionally apply to the operations and/or method, which may in embodiments be performed by and/or within the apparatus. Alternatively, the operations and/or method of FIG. 8 may be performed by and/or within a similar or entirely different apparatus. Moreover, the apparatus of FIG. 1 may perform operations and/or methods the same as, similar to, or entirely different than those of FIG. 8.

The method includes determining to allow a first logical processor, of a plurality of logical processors, to operate in a relaxed memory access synchronization mode, at block 861. In some embodiments, it may be determined to allow the first logical processor to operate in the relaxed memory access synchronization mode when no other logical processors are currently accessing a portion of memory that the first logical processor is accessing.

The method also includes modifying one or more architecturally-visible bits (e.g., in architecturally-visible registers of the processor) to indicate that the first logical processor is allowed to operate in the relaxed memory access synchronization mode, at block 862. Alternatively, non-architectural bits may optionally be used, if desired. In some embodiments, when allowed to operate in the relaxed memory access synchronization mode, the first logical processor may be operable to prevent a memory access synchronization instruction from synchronizing accesses to a shared memory (e.g., a previously shared memory portion that currently only the first logical processor is using).

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 9A is a block diagram illustrating both an exemplary in-order pipeline and an exemplary register renaming, out-of-order issue/execution pipeline according to embodiments of the invention. FIG. 9B is a block diagram illustrating both an exemplary embodiment of an in-order architecture core and an exemplary register renaming, out-of-order issue/execution architecture core to be included in a processor according to embodiments of the invention. The solid lined boxes in FIGS. 9A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 9A, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924.

FIG. 9B shows processor core 990 including a front end unit 930 coupled to an execution engine unit 950, and both are coupled to a memory unit 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression engine, coprocessor, general purpose computing graphics processing unit (GPGPU) core, graphics core, or the like.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (or decoder) may decode instructions, and generate as an output one or more micro-operations, micro-code entry points, microinstructions, other instructions, or other control signals, which are decoded from, or which otherwise reflect, or are derived from, the original instructions. The decode unit 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode unit 940 or otherwise within the front end unit 930). The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservations stations, central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 958 comprises a vector registers unit, a write mask registers unit, and a scalar registers unit. The register units may provide architectural vector registers, vector mask registers, and general purpose registers. The physical register file(s) unit(s) 958 is overlapped by the retirement unit 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 964).

It should also be understood that where separate pipelines are used, one or more of these pipelines may be out-of-order issue/execution and the rest in-order.

The set of memory access units 964 is coupled to the memory unit 970, which includes a data TLB unit 972 coupled to a data cache unit 974 coupled to a level 2 (L2) cache unit 976. In one exemplary embodiment, the memory access units 964 may include a load unit, a store address unit, and a store data unit, each of which is coupled to the data TLB unit 972 in the memory unit 970. The instruction cache unit 934 is further coupled to a level 2 (L2) cache unit 976 in the memory unit 970. The L2 cache unit 976 is coupled to one or more other levels of cache and eventually to a main memory.

By way of example, the exemplary register renaming, out-of-order issue/execution core architecture may implement the pipeline 900 as follows: 1) the instruction fetch 938 performs the fetch and length decoding stages 902 and 904; 2) the decode unit 940 performs the decode stage 906; 3) the rename/allocator unit 952 performs the allocation stage 908 and renaming stage 910; 4) the scheduler unit(s) 956 performs the schedule stage 912; 5) the physical register file(s) unit(s) 958 and the memory unit 970 perform the register read/memory read stage 914; the execution cluster 960 perform the execute stage 916; 6) the memory unit 970 and the physical register file(s) unit(s) 958 perform the write back/memory write stage 918; 7) various units may be involved in the exception handling stage 922; and 8) the retirement unit 954 and the physical register file(s) unit(s) 958 perform the commit stage 924.

The core 990 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 990 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 934/974 and a shared L2 cache unit 976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 10B:
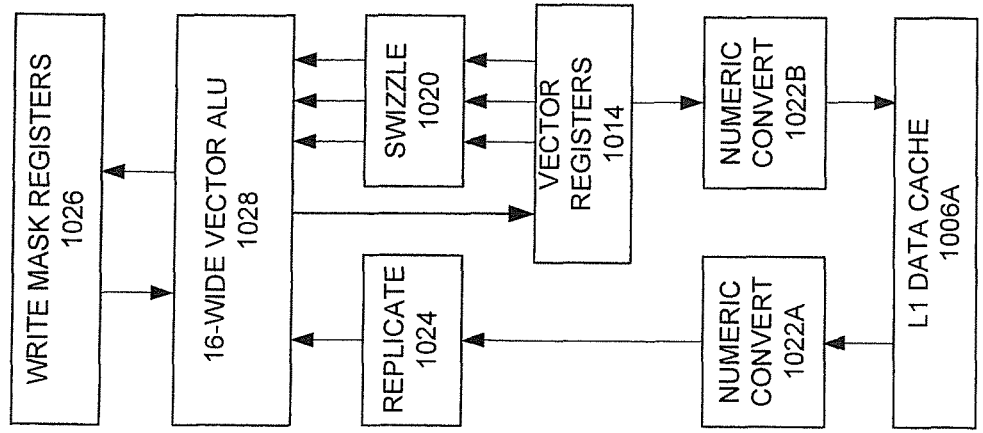
FIG. 10B is an expanded view of part of the processor core in FIG. 10A according to embodiments of the invention.
Figure 10A:
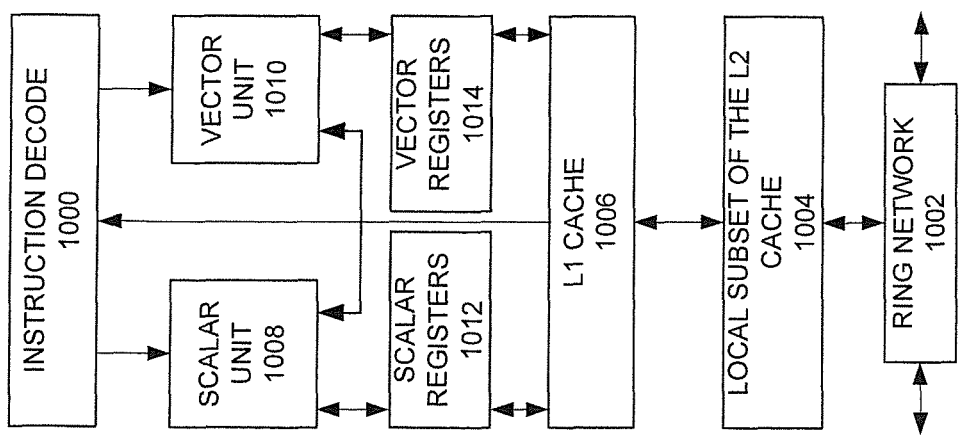
FIG. 10A is a block diagram of a single processor core, along with its connection to the on-die interconnect network and with its local subset of the Level 2 (L2) cache, according to embodiments of the invention.

FIGS. 10A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 10A is a block diagram of a single processor core, along with its connection to the on-die interconnect network 1002 and with its local subset of the Level 2 (L2) cache 1004, according to embodiments of the invention. In one embodiment, an instruction decoder 1000 supports the x86 instruction set with a packed data instruction set extension. An L1 cache 1006 allows low-latency accesses to cache memory into the scalar and vector units. While in one embodiment (to simplify the design), a scalar unit 1008 and a vector unit 1010 use separate register sets (respectively, scalar registers 1012 and vector registers 1014) and data transferred between them is written to memory and then read back in from a level 1 (L1) cache 1006, alternative embodiments of the invention may use a different approach (e.g., use a single register set or include a communication path that allow data to be transferred between the two register files without being written and read back).

The local subset of the L2 cache 1004 is part of a global L2 cache that is divided into separate local subsets, one per processor core. Each processor core has a direct access path to its own local subset of the L2 cache 1004. Data read by a processor core is stored in its L2 cache subset 1004 and can be accessed quickly, in parallel with other processor cores accessing their own local L2 cache subsets. Data written by a processor core is stored in its own L2 cache subset 1004 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 10B is an expanded view of part of the processor core in FIG. 10A according to embodiments of the invention. FIG. 10B includes an L1 data cache 1006A part of the L1 cache 1004, as well as more detail regarding the vector unit 1010 and the vector registers 1014. Specifically, the vector unit 1010 is a 16-wide vector processing unit (VPU) (see the 16-wide ALU 1028), which executes one or more of integer, single-precision float, and double-precision float instructions. The VPU supports swizzling the register inputs with swizzle unit 1020, numeric conversion with numeric convert units 1022A-B, and replication with replication unit 1024 on the memory input. Write mask registers 1026 allow predicating resulting vector writes.

Processor with Integrated Memory Controller and Graphics

Figure 11:
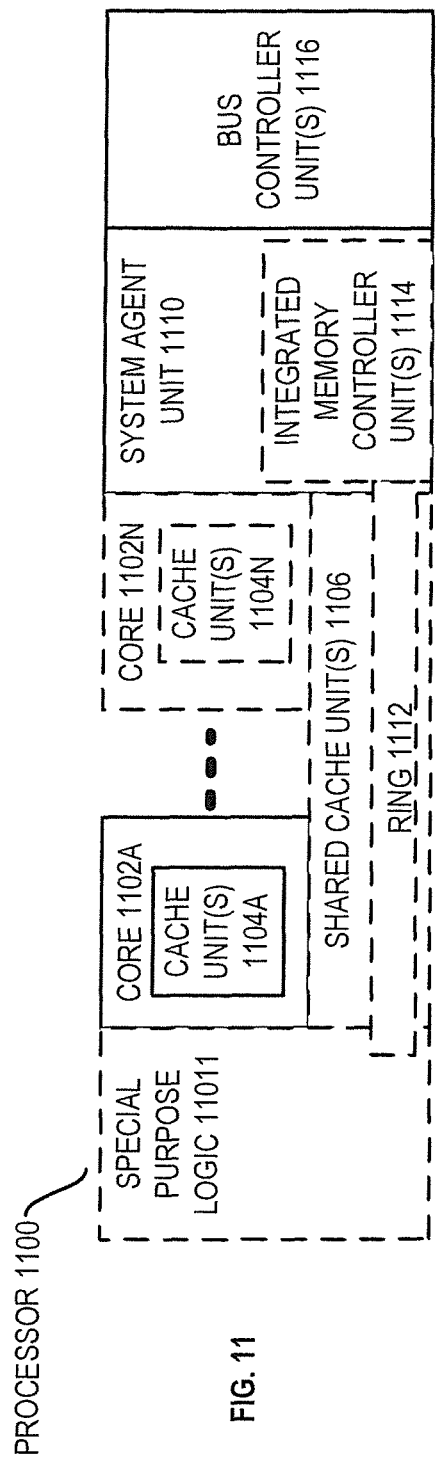
FIG. 11 is a block diagram of a processor that may have more than one core, may have an integrated memory controller, and may have integrated graphics according to embodiments of the invention.

FIG. 11 is a block diagram of a processor 1100 that may have more than one core, may have an integrated memory controller, and may have integrated graphics according to embodiments of the invention. The solid lined boxes in FIG. 11 illustrate a processor 1100 with a single core 1102A, a system agent 1110, a set of one or more bus controller units 1116, while the optional addition of the dashed lined boxes illustrates an alternative processor 1100 with multiple cores 1102A-N, a set of one or more integrated memory controller unit(s) 1114 in the system agent unit 1110, and special purpose logic 1108.

Thus, different implementations of the processor 1100 may include: 1) a CPU with the special purpose logic 1108 being integrated graphics and/or scientific (throughput) logic (which may include one or more cores), and the cores 1102A-N being one or more general purpose cores (e.g., general purpose in-order cores, general purpose out-of-order cores, a combination of the two); 2) a coprocessor with the cores 1102A-N being a large number of special purpose cores intended primarily for graphics and/or scientific (throughput); and 3) a coprocessor with the cores 1102A-N being a large number of general purpose in-order cores. Thus, the processor 1100 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1100 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1106, and external memory (not shown) coupled to the set of integrated memory controller units 1114. The set of shared cache units 1106 may include one or more mid-level caches, such as level 2 (L2), level 3 (L3), level 4 (L4), or other levels of cache, a last level cache (LLC), and/or combinations thereof. While in one embodiment a ring based interconnect unit 1112 interconnects the integrated graphics logic 1108, the set of shared cache units 1106, and the system agent unit 1110/integrated memory controller unit(s) 1114, alternative embodiments may use any number of well-known techniques for interconnecting such units. In one embodiment, coherency is maintained between one or more cache units 1106 and cores 1102-A-N.

In some embodiments, one or more of the cores 1102A-N are capable of multi-threading. The system agent 1110 includes those components coordinating and operating cores 1102A-N. The system agent unit 1110 may include for example a power control unit (PCU) and a display unit. The PCU may be or include logic and components needed for regulating the power state of the cores 1102A-N and the integrated graphics logic 1108. The display unit is for driving one or more externally connected displays.

The cores 1102A-N may be homogenous or heterogeneous in terms of architecture instruction set; that is, two or more of the cores 1102A-N may be capable of execution the same instruction set, while others may be capable of executing only a subset of that instruction set or a different instruction set.

Exemplary Computer Architectures

FIGS. 12-15 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 12:
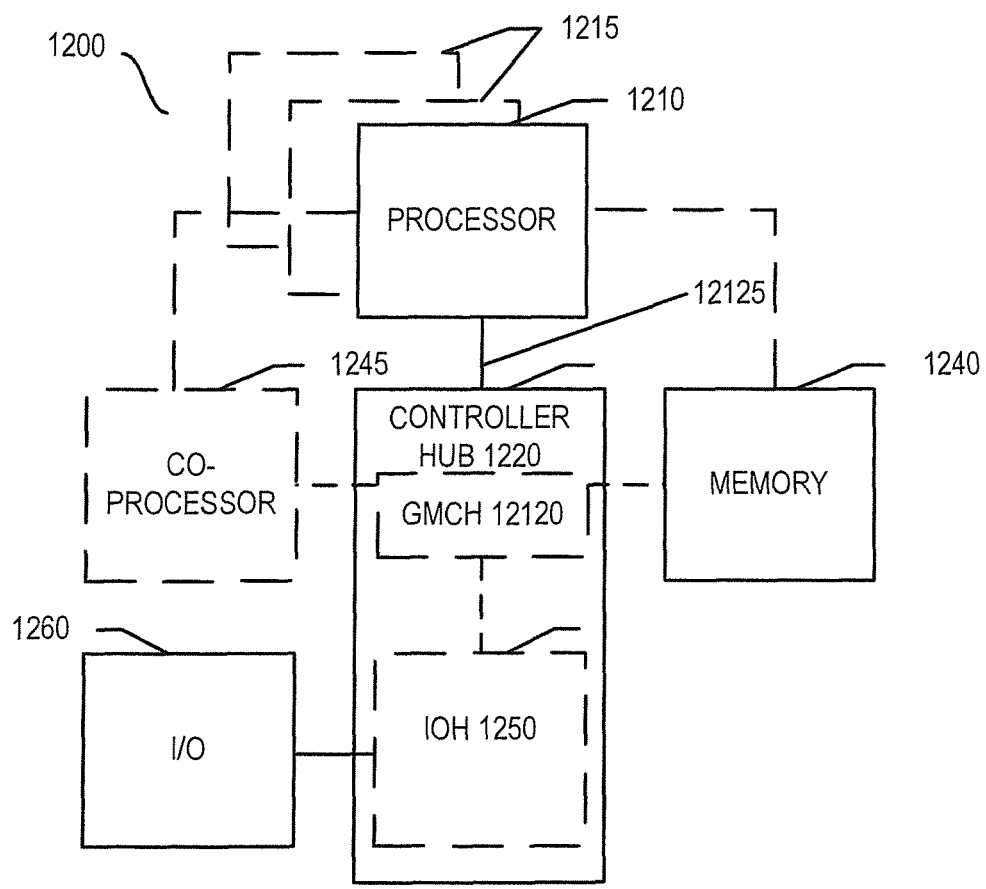
FIG. 12 shown is a block diagram of a system in accordance with one embodiment of the present invention.

Referring now to FIG. 12, shown is a block diagram of a system 1200 in accordance with one embodiment of the present invention. The system 1200 may include one or more processors 1210, 1215, which are coupled to a controller hub 1220. In one embodiment the controller hub 1220 includes a graphics memory controller hub (GMCH) 1290 and an Input/Output Hub (IOH) 1250 (which may be on separate chips); the GMCH 1290 includes memory and graphics controllers to which are coupled memory 1240 and a coprocessor 1245; the IOH 1250 is couples input/output (I/O) devices 1260 to the GMCH 1290. Alternatively, one or both of the memory and graphics controllers are integrated within the processor (as described herein), the memory 1240 and the coprocessor 1245 are coupled directly to the processor 1210, and the controller hub 1220 in a single chip with the IOH 1250.

The optional nature of additional processors 1215 is denoted in FIG. 12 with broken lines. Each processor 1210, 1215 may include one or more of the processing cores described herein and may be some version of the processor 1100.

The memory 1240 may be, for example, dynamic random access memory (DRAM), phase change memory (PCM), or a combination of the two. For at least one embodiment, the controller hub 1220 communicates with the processor(s) 1210, 1215 via a multi-drop bus, such as a frontside bus (FSB), point-to-point interface such as QuickPath Interconnect (QPI), or similar connection 1295.

In one embodiment, the coprocessor 1245 is a special-purpose processor, such as, for example, a high-throughput MIC processor, a network or communication processor, compression engine, graphics processor, GPGPU, embedded processor, or the like. In one embodiment, controller hub 1220 may include an integrated graphics accelerator.

There can be a variety of differences between the physical resources 1210, 1215 in terms of a spectrum of metrics of merit including architectural, microarchitectural, thermal, power consumption characteristics, and the like.

In one embodiment, the processor 1210 executes instructions that control data processing operations of a general type. Embedded within the instructions may be coprocessor instructions. The processor 1210 recognizes these coprocessor instructions as being of a type that should be executed by the attached coprocessor 1245. Accordingly, the processor 1210 issues these coprocessor instructions (or control signals representing coprocessor instructions) on a coprocessor bus or other interconnect, to coprocessor 1245. Coprocessor(s) 1245 accept and execute the received coprocessor instructions.

Figure 13:
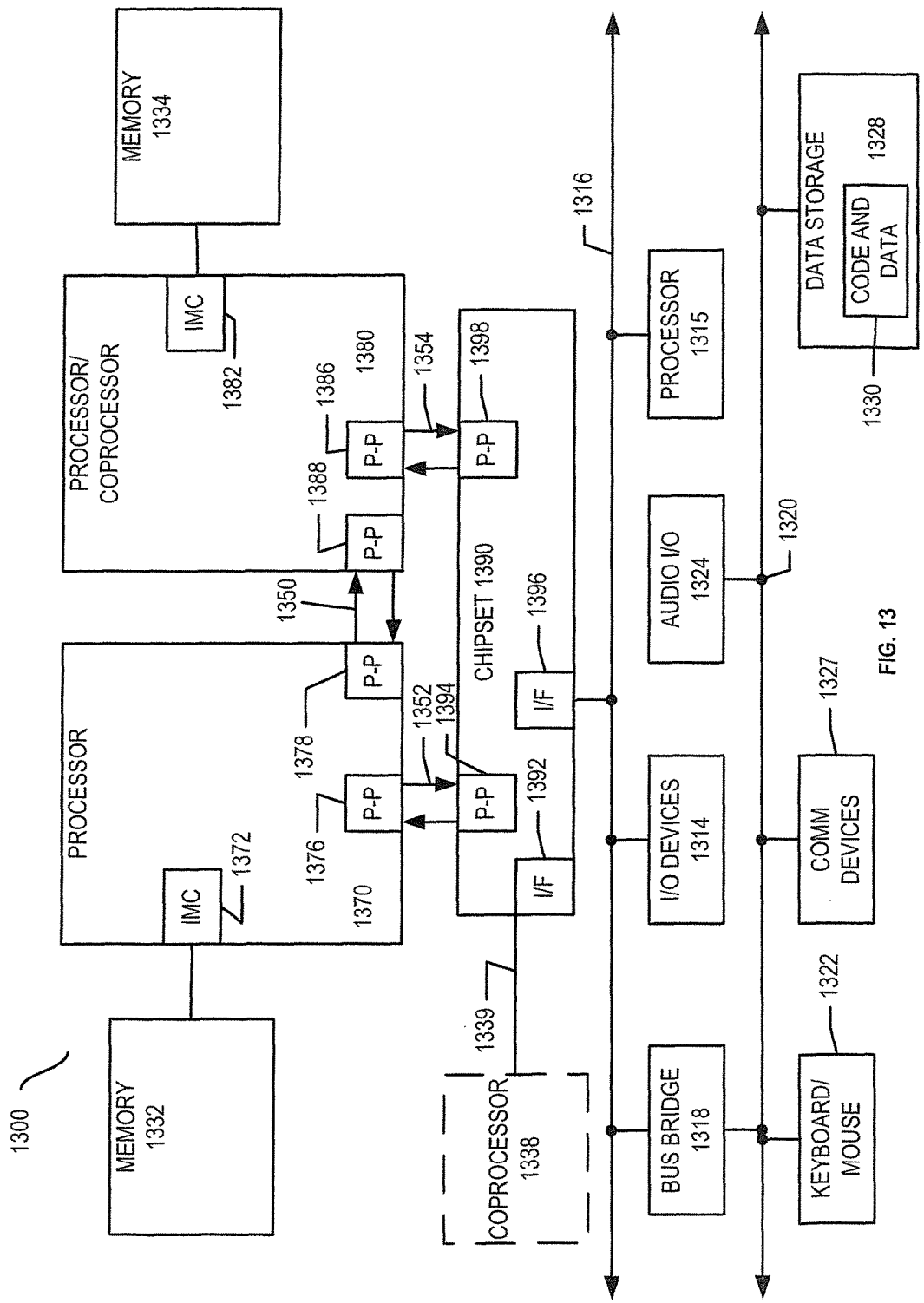
FIG. 13 shown is a block diagram of a first more specific exemplary system in accordance with an embodiment of the present invention.

Referring now to FIG. 13, shown is a block diagram of a first more specific exemplary system 1300 in accordance with an embodiment of the present invention. As shown in FIG. 13, multiprocessor system 1300 is a point-to-point interconnect system, and includes a first processor 1370 and a second processor 1380 coupled via a point-to-point interconnect 1350. Each of processors 1370 and 1380 may be some version of the processor 1100. In one embodiment of the invention, processors 1370 and 1380 are respectively processors 1210 and 1215, while coprocessor 1338 is coprocessor 1245. In another embodiment, processors 1370 and 1380 are respectively processor 1210 coprocessor 1245.

Processors 1370 and 1380 are shown including integrated memory controller (IMC) units 1372 and 1382, respectively. Processor 1370 also includes as part of its bus controller units point-to-point (P-P) interfaces 1376 and 1378; similarly, second processor 1380 includes P-P interfaces 1386 and 1388. Processors 1370, 1380 may exchange information via a point-to-point (P-P) interface 1350 using P-P interface circuits 1378, 1388. As shown in FIG. 13, IMCs 1372 and 1382 couple the processors to respective memories, namely a memory 1332 and a memory 1334, which may be portions of main memory locally attached to the respective processors.

Processors 1370, 1380 may each exchange information with a chipset 1390 via individual P-P interfaces 1352, 1354 using point to point interface circuits 1376, 1394, 1386, 1398. Chipset 1390 may optionally exchange information with the coprocessor 1338 via a high-performance interface 1339. In one embodiment, the coprocessor 1338 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present invention is not so limited.

As shown in FIG. 13, various I/O devices 1314 may be coupled to first bus 1316, along with a bus bridge 1318 which couples first bus 1316 to a second bus 1320. In one embodiment, one or more additional processor(s) 1315, such as coprocessors, high-throughput MIC processors, GPGPU's, accelerators (such as, e.g., graphics accelerators or digital signal processing (DSP) units), field programmable gate arrays, or any other processor, are coupled to first bus 1316. In one embodiment, second bus 1320 may be a low pin count (LPC) bus. Various devices may be coupled to a second bus 1320 including, for example, a keyboard and/or mouse 1322, communication devices 1327 and a storage unit 1328 such as a disk drive or other mass storage device which may include instructions/code and data 1330, in one embodiment. Further, an audio I/O 1324 may be coupled to the second bus 1320. Note that other architectures are possible. For example, instead of the point-to-point architecture of FIG. 13, a system may implement a multi-drop bus or other such architecture.

Figure 14:
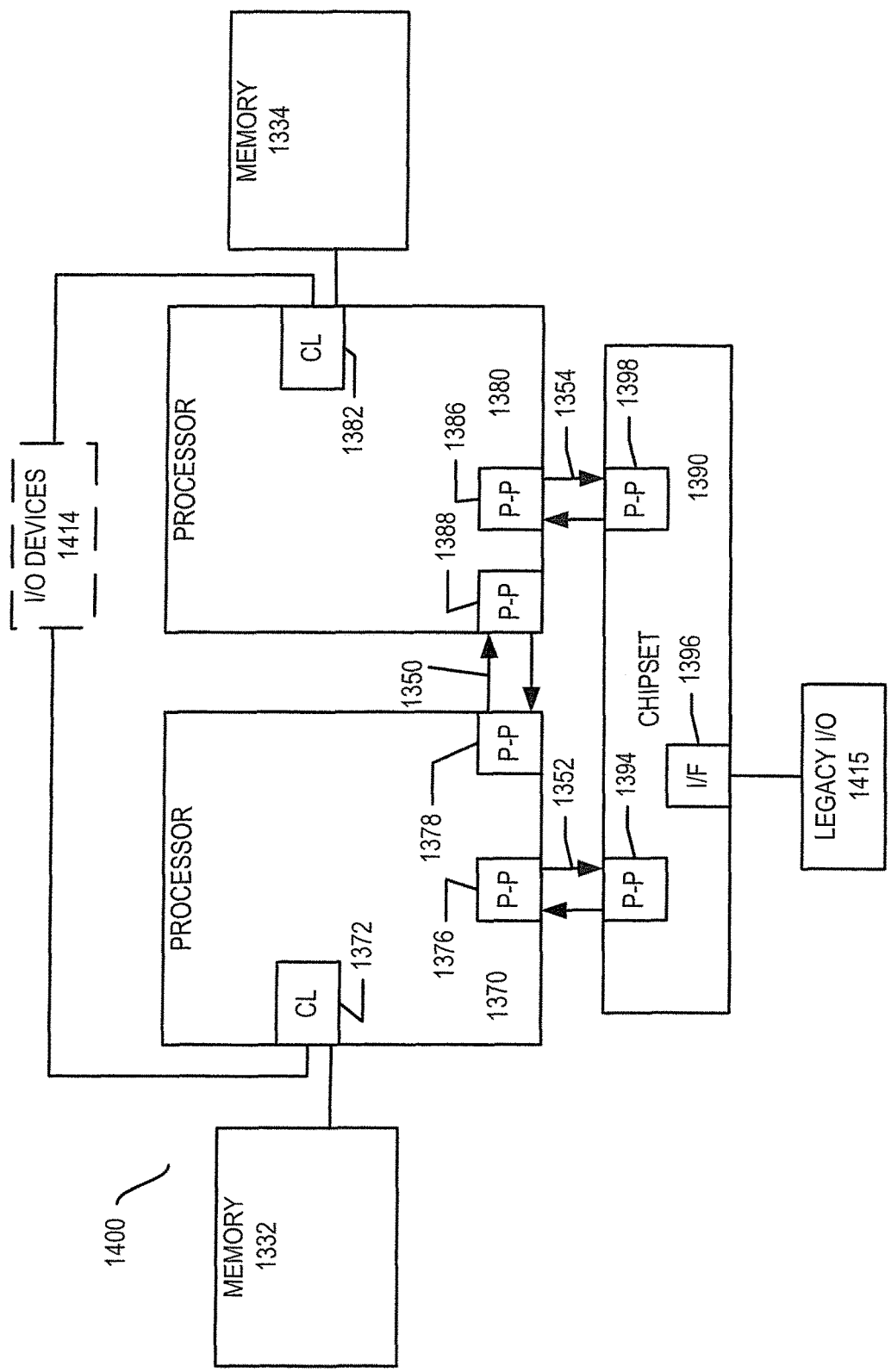
FIG. 14 shown is a block diagram of a second more specific exemplary system in accordance with an embodiment of the present invention.

Referring now to FIG. 14, shown is a block diagram of a second more specific exemplary system 1400 in accordance with an embodiment of the present invention. Like elements in FIGS. 13 and 14 bear like reference numerals, and certain aspects of FIG. 13 have been omitted from FIG. 14 in order to avoid obscuring other aspects of FIG. 14.

FIG. 14 illustrates that the processors 1370, 1380 may include integrated memory and I/O control logic ("CL") 1372 and 1382, respectively. Thus, the CL 1372, 1382 include integrated memory controller units and include I/O control logic. FIG. 14 illustrates that not only are the memories 1332, 1334 coupled to the CL 1372, 1382, but also that I/O devices 1414 are also coupled to the control logic 1372, 1382. Legacy I/O devices 1415 are coupled to the chipset 1390.

Figure 15:
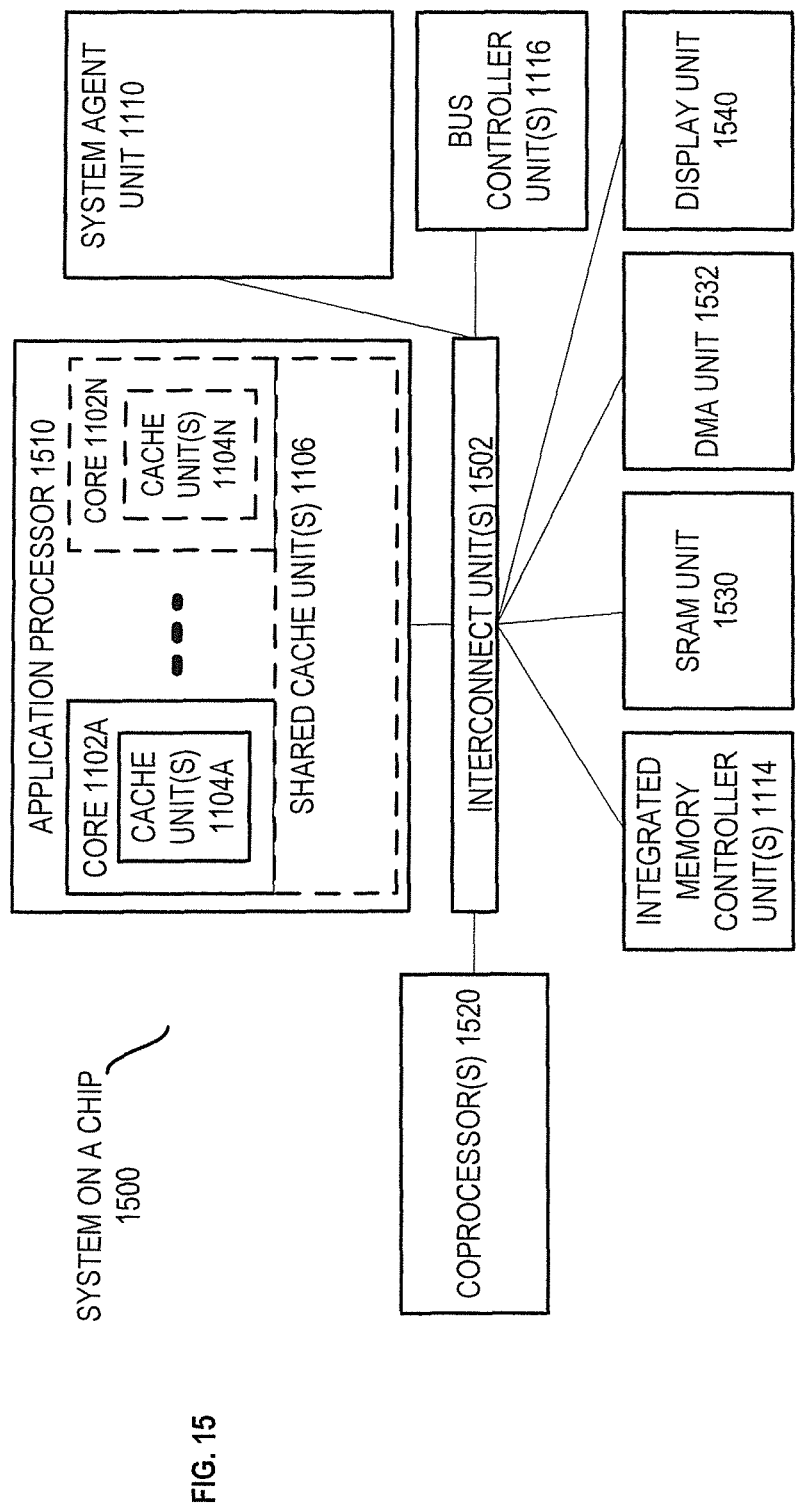
FIG. 15 shown is a block diagram of a SoC in accordance with an embodiment of the present invention.

Referring now to FIG. 15, shown is a block diagram of a SoC 1500 in accordance with an embodiment of the present invention. Similar elements in FIG. 11 bear like reference numerals. Also, dashed lined boxes are optional features on more advanced SoCs. In FIG. 15, an interconnect unit(s) 1502 is coupled to: an application processor 1510 which includes a set of one or more cores 202A-N and shared cache unit(s) 1106; a system agent unit 1110; a bus controller unit(s) 1116; an integrated memory controller unit(s) 1114; a set or one or more coprocessors 1520 which may include integrated graphics logic, an image processor, an audio processor, and a video processor; an static random access memory (SRAM) unit 1530; a direct memory access (DMA) unit 1532; and a display unit 1540 for coupling to one or more external displays. In one embodiment, the coprocessor(s) 1520 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1330 illustrated in FIG. 13, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 16 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 16 shows a program in a high level language 1602 may be compiled using an x86 compiler 1604 to generate x86 binary code 1606 that may be natively executed by a processor with at least one x86 instruction set core 1616. The processor with at least one x86 instruction set core 1616 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1604 represents a compiler that is operable to generate x86 binary code 1606 (e.g., object code) that can, with or without additional linkage processing, be executed on the processor with at least one x86 instruction set core 1616. Similarly, FIG. 16 shows the program in the high level language 1602 may be compiled using an alternative instruction set compiler 1608 to generate alternative instruction set binary code 1610 that may be natively executed by a processor without at least one x86 instruction set core 1614 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1612 is used to convert the x86 binary code 1606 into code that may be natively executed by the processor without an x86 instruction set core 1614. This converted code is not likely to be the same as the alternative instruction set binary code 1610 because an instruction converter capable of this is difficult to make; however, the converted code will accomplish the general operation and be made up of instructions from the alternative instruction set. Thus, the instruction converter 1612 represents software, firmware, hardware, or a combination thereof that, through emulation, simulation or any other process, allows a processor or other electronic device that does not have an x86 instruction set processor or core to execute the x86 binary code 1606.

Components, features, and details described for any of FIGS. 3-7 may also optionally be used in any of FIGS. 1-2. Moreover, components, features, and details described herein for any of the apparatus may also optionally be used in any of the methods described herein, which in embodiments may be performed by and/or with such apparatus.

EXAMPLE EMBODIMENTS

The following examples pertain to further embodiments. Specifics in the examples may be used anywhere in one or more embodiments.

Example 1 is a processor. The processor includes a plurality of logical processors. The processor also includes a first logical processor of the plurality, the first logical processor to execute software that includes a memory access synchronization instruction that is to synchronize accesses to a memory. The processor also includes memory access synchronization relaxation logic to prevent the memory access synchronization instruction from synchronizing accesses to the memory when the processor is in a relaxed memory access synchronization mode.

Example 2 includes the subject matter of Example 1 and optionally in which the processor has one or more architecturally-visible bits to indicate that the processor is in the relaxed memory access synchronization mode.

Example 3 includes the subject matter of Example 2 and optionally in which the one or more architecturally-visible bits are accessible to software to allow the software to modify the one or more architecturally-visible bits to indicate that the processor is in the relaxed memory access synchronization mode.

Example 4 includes the subject matter of Example 2 and optionally in which the one or more architecturally-visible bits correspond to the memory, and further including another set of one or more architecturally-visible bits which correspond to a second, different memory.

Example 5 includes the subject matter of any one of Examples 1-4 and optionally in which the memory access synchronization instruction is selected from a fence instruction, a barrier instruction, and a lock instruction, and in which the memory access synchronization relaxation logic includes logic to convert the memory access synchronization instruction to a no operation (NOP).

Example 6 includes the subject matter of any one of Examples 1-4 and optionally in which the memory access synchronization instruction is selected from a fence instruction and a barrier instruction, and in which the memory access synchronization relaxation logic includes logic of a memory subsystem to omit performing a corresponding one of a fence operation and a barrier operation.

Example 7 includes the subject matter of any one of Examples 1-4 and optionally in which the memory access synchronization instruction includes a conditional memory access instruction selected from a conditional load instruction and a conditional store instruction, and in which the memory access synchronization relaxation logic includes logic to convert the conditional memory access instruction to a corresponding un-conditional memory access instruction.

Example 8 includes the subject matter of any one of Examples 1-4 and optionally in which the memory access synchronization instruction is selected from a read-modify-write instruction, a compare-and-swap instruction, a test-and-set instruction, and a store-conditional instruction of a load-link/store-conditional pair of instructions, and in which the memory access synchronization relaxation logic includes logic to convert the memory access synchronization instruction to an instruction selected from a store and a write.

Example 9 includes the subject matter of any one of Examples 1-4 and optionally in which the memory access synchronization instruction includes a conditional branch instruction, and in which the memory access synchronization relaxation logic includes logic of a branch predictor to cause the conditional branch to be predicted a particular way when the processor is in a relaxed memory access synchronization mode.

Example 10 is a method in a processor. The method includes fetching a set of instructions for a first logical processor of a plurality of logical processors. The set of instructions include a memory access synchronization instruction to synchronize accesses to a memory. The method also includes accessing the memory from the first logical processor without respecting the synchronization of the memory access synchronization instruction.

Example 11 includes the subject matter of Example 10 and optionally further including determining that the processor is in a relaxed memory access synchronization mode by checking one or more architecturally visible bits that indicate that the processor is in the relaxed memory access synchronization mode.

Example 12 includes the subject matter of Example 11 and optionally further including software modifying the one or more architecturally visible bits to indicate that the processor is in a relaxed memory access synchronization mode.

Example 13 includes the subject matter of Example 10 and optionally further including preventing the memory access synchronization instruction from synchronizing the accesses to the memory.

Example 14 includes the subject matter of Example 10 and optionally in which fetching includes fetching the memory access synchronization instruction selected from a fence instruction, a barrier instruction, and a lock instruction, and further including converting the memory access synchronization instruction to a no operation (NOP).

Example 15 includes the subject matter of Example 10 and optionally in which the memory access synchronization instruction includes an instruction selected from a fence instruction and a barrier instruction, and further including omitting performing a corresponding one of a fence operation and a barrier operation.

Example 16 includes the subject matter of Example 10 and optionally in which fetching includes fetching the memory access synchronization instruction which is an instruction selected from a read-modify-write instruction, a compare-and-swap instruction, a test-and-set instruction, and a store-conditional instruction of a load-link/store-conditional pair of instructions, and further including converting the conditional memory access instruction to an instruction selected from a store and a write.

Example 17 includes the subject matter of Example 10 and optionally in which fetching includes fetching the memory access synchronization instruction which is a conditional memory access instruction selected from a conditional load instruction and a conditional store instruction, and further including converting the conditional memory access instruction to a corresponding un-conditional memory access instruction.

Example 18 includes the subject matter of Example 10 and optionally in which fetching includes fetching the memory access synchronization instruction which is a conditional branch instruction, and further including predicting the conditional branch based on the processor being in a relaxed memory access synchronization mode.

Example 19 is a system to process instructions that includes an interconnect. The system also includes a processor coupled with the interconnect. The system also includes a dynamic random access memory (DRAM) coupled with the interconnect. The DRAM is to store instructions that, when executed by a machine, will cause the machine to perform operations. The operations include determining to allow a first logical processor, of a plurality of logical processors of the processor, to operate in a relaxed memory access synchronization mode. The operations also include modifying one or more architecturally-visible bits of the processor to indicate that the first logical processor is allowed to operate in the relaxed memory access synchronization mode. When allowed to operate in the relaxed memory access synchronization mode, the first logical processor is to prevent a memory access synchronization instruction from synchronizing accesses to a memory.

Example 20 includes the subject matter of Example 19 and optionally in which the instructions includes instructions of an operating system.

Example 21 includes the subject matter of any of Examples 19-20 and optionally in which the instructions comprise instructions that will cause the machine to determine to allow the first logical processor to operate in the relaxed memory access synchronization mode when no other logical processors access the memory that the first logical processor is to prevent the memory access synchronization instruction from synchronizing accesses to.

Example 22 is an article of manufacture including a non-transitory machine-readable storage medium. The non-transitory machine-readable storage medium stores instructions that, if executed by a machine, will cause the machine to perform operations. The operations include determining to allow a first logical processor, of a plurality of logical processors of the machine, to operate in a relaxed memory access synchronization mode. The operations include modifying one or more architecturally-visible bits of the machine to indicate that the first logical processor is allowed to operate in the relaxed memory access synchronization mode. When allowed to operate in the relaxed memory access synchronization mode, the first logical processor is to prevent a memory access synchronization instruction from synchronizing accesses to a memory.

Example 23 includes the subject matter of Example 22 and optionally in which the instructions comprise instructions that will cause the machine to determine to allow the first logical processor to operate in the relaxed memory access synchronization mode when no other logical processors access the memory that the first logical processor is to prevent the memory access synchronization instruction from synchronizing accesses to.

Example 24 includes the subject matter of any of Example 22-23 and optionally in which the instructions includes instructions of an operating system.

Example 25 is a processor. The processor includes a fetch unit to fetch a set of instructions for a first logical processor of a plurality of logical processors. The set of instructions including a memory access synchronization instruction to synchronize accesses to a memory. The processor also includes means for preventing memory access synchronization of the memory access synchronization instruction.

Example 26 is an apparatus. The apparatus includes means for determining to allow a first logical processor, of a plurality of logical processors of the machine, to operate in a relaxed memory access synchronization mode. The apparatus also includes means for modifying one or more architecturally-visible bits of the machine to indicate that the first logical processor is allowed to operate in the relaxed memory access synchronization mode. When allowed to operate in the relaxed memory access synchronization mode, the first logical processor is to prevent a memory access synchronization instruction from synchronizing accesses to a memory.

Example 27 is an apparatus to perform the method of any of Examples 10-18.

Example 28 is an apparatus including means for performing the method of any of Examples 10-18.

Example 29 is an apparatus to perform a method substantially as described herein.

Example 30 is an apparatus including means for performing a method substantially as described herein.

In the description and claims, the terms "coupled" and "connected," along with their derivatives, may have been used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, components may be coupled together through one or more intervening components. In the figures, arrows are used to show connections and couplings.

In the description and claims, the term "logic" may have been used. As used herein, logic may include a module such as hardware, firmware, software, or a combination thereof. Examples of logic include integrated circuitry, application specific integrated circuits, analog circuits, digital circuits, programmed logic devices, memory devices including instructions, etc. In some embodiments, the hardware logic may include transistors and/or gates potentially along with other circuitry components.

The term "and/or" may have been used. As used herein, the term "and/or" means one or the other or both (e.g., A and/or B means A or B or both A and B).

In the description above, for purposes of explanation, numerous specific details have been set forth in order to provide a thorough understanding of embodiments of the invention. It will be apparent however, to one skilled in the art, that one or more other embodiments may be practiced without some of these specific details. The particular embodiments described are not provided to limit the invention but to illustrate it through example embodiments. The scope of the invention is not to be determined by the specific examples but only by the claims. In other instances, well-known circuits, structures, devices, and operations have been shown in block diagram form or without detail in order to avoid obscuring the understanding of the description.

Where considered appropriate, reference numerals, or terminal portions of reference numerals, have been repeated among the figures to indicate corresponding or analogous elements, which may optionally have similar or the same characteristics, unless specified or clearly apparent otherwise. In some cases, where multiple components have been described, they may be incorporated into a single component. In other cases, where a single component has been described, it may be partitioned into multiple components.

Various operations and methods have been described. Some of the methods have been described in a relatively basic form in the flow diagrams, but operations may optionally be added to and/or removed from the methods. In addition, while the flow diagrams show a particular order of the operations according to example embodiments, that particular order is exemplary. Alternate embodiments may optionally perform the operations in different order, combine certain operations, overlap certain operations, etc.

Some embodiments include an article of manufacture (e.g., a computer program product) that includes a machine-readable medium. The medium may include a mechanism that provides, for example stores, information in a form that is readable by the machine. The machine-readable medium may provide, or have stored thereon, one or more instructions, that if and/or when executed by a machine are operable to cause the machine to perform and/or result in the machine performing one or operations, methods, or techniques disclosed herein.

In some embodiments, the machine-readable medium may include a tangible and/or non-transitory machine-readable storage medium. For example, the tangible and/or non-transitory machine-readable storage medium may include a floppy diskette, an optical storage medium, an optical disk, an optical data storage device, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, a phase-change data storage material, a non-volatile memory, a non-volatile data storage device, a non-transitory memory, a non-transitory data storage device, or the like. The non-transitory machine-readable storage medium does not consist of a transitory propagated signal. In another embodiment, the machine-readable medium may include a transitory machine-readable communication medium, for example, the electrical, optical, acoustical or other forms of propagated signals, such as carrier waves, infrared signals, digital signals, or the like.

Examples of suitable machines include, but are not limited to, general-purpose processors, special-purpose processors, instruction processing apparatus, digital logic circuits, integrated circuits, and the like. Still other examples of suitable machines include computing devices and other electronic devices that incorporate such processors, instruction processing apparatus, digital logic circuits, or integrated circuits. Examples of such computing devices and electronic devices include, but are not limited to, desktop computers, laptop computers, notebook computers, tablet computers, netbooks, smartphones, cellular phones, servers, network devices (e.g., routers and switches), Mobile Internet devices (MIDs), media players, smart televisions, nettops, set-top boxes, and video game controllers.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A processor comprising:
   a plurality of logical processors, including a first logical processor, the first logical processor to execute software that includes a memory access synchronization instruction that is to synchronize accesses to at least a portion of a memory; and memory access synchronization relaxation logic to prevent the memory access synchronization instruction from synchronizing accesses to said at least the portion of the memory when the processor is in a relaxed memory access synchronization mode, wherein the processor has one or more architecturally-visible bits to indicate that the processor is in the relaxed memory access synchronization mode.

2. The processor of claim 1, wherein the one or more architecturally-visible bits are accessible to software to allow the software to modify the one or more architecturally-visible bits to indicate that the processor is in the relaxed memory access synchronization mode.

3. The processor of claim 1, wherein the one or more architecturally-visible bits correspond to said at least the portion of the memory, and further comprising another set of one or more architecturally-visible bits which correspond to a second, different portion of the memory.

4. The processor of claim 1, wherein the memory access synchronization instruction is selected from a fence instruction and a barrier instruction, and wherein the memory access synchronization relaxation logic comprises logic to convert the memory access synchronization instruction to a no operation (NOP).

5. The processor of claim 1, wherein the memory access synchronization instruction is selected from a fence instruction and a barrier instruction, and wherein the memory access synchronization relaxation logic comprises logic of a memory subsystem to omit performing a corresponding one of a fence operation and a barrier operation.

6. The processor of claim 1, wherein the memory access synchronization instruction comprises a conditional memory access instruction selected from a conditional load instruction and a conditional store instruction, and wherein the memory access synchronization relaxation logic comprises logic to convert the conditional memory access instruction to a corresponding un-conditional memory access instruction.

7. The processor of claim 1, wherein the memory access synchronization instruction is selected from a read-modify-write instruction, a compare-and-swap instruction, a test-and-set instruction, and a store-conditional instruction of a load-link/store-conditional pair of instructions, and wherein the memory access synchronization relaxation logic comprises logic to convert the memory access synchronization instruction to an instruction selected from a store and a write.

8. The processor of claim 1, wherein the memory access synchronization instruction comprises a conditional branch instruction, and wherein the memory access synchronization relaxation logic comprises logic of a branch predictor to cause the conditional branch instruction to be predicted a particular way when the processor is in a relaxed memory access synchronization mode.

9. An article of manufacture comprising a non-transitory machine-readable storage medium, the non-transitory machine-readable storage medium storing instructions that, if executed by a machine, will cause the machine to perform operations comprising to:
determine to allow a first logical processor, of a plurality of logical processors of the machine, to operate in a relaxed memory access synchronization mode; and
modify one or more architecturally-visible bits of the machine to indicate that the first logical processor is allowed to operate in the relaxed memory access synchronization mode,
wherein, when allowed to operate in the relaxed memory access synchronization mode, the first logical processor is to prevent a memory access synchronization instruction from synchronizing accesses to at least a portion of a memory.

10. The article of manufacture of claim 9, wherein the instructions comprise instructions that if executed by the machine will cause the machine to determine to allow the first logical processor to operate in the relaxed memory access synchronization mode when no other logical processors of the machine access said at least the portion of the memory that the first logical processor is to prevent the memory access synchronization instruction from synchronizing accesses to.

11. A processor comprising:
a plurality of logical processors, including a first logical processor, the first logical processor to execute software that includes one or more conditional memory access instructions; and
a decode unit of the first logical processor, the decode unit to convert the one or more conditional memory access instructions to one or more un-conditional memory access operations when the processor is in a relaxed memory access synchronization mode,
wherein the first logical processor is to access at least first portion of a memory without respecting synchronization thereto when the processor is in the relaxed memory access synchronization mode.

12. The processor of claim 11, wherein the processor is to be put in the relaxed memory access synchronization mode at runtime based on software.

13. The processor of claim 11, wherein the processor has one or more architecturally-visible bits to indicate that the processor is in the relaxed memory access synchronization mode.

14. The processor of claim 11, wherein the one or more conditional memory access instructions comprise a conditional store instruction, and wherein the one or more un-conditional memory access operations comprise an un-conditional store operation.

15. The processor of claim 11, wherein the one or more conditional memory access instructions comprise a conditional load instruction, and wherein the one or more un-conditional memory access operations comprise an un-conditional load operation.

16. The processor of claim 11, wherein the one or more conditional memory access instructions comprise a load-link and store-conditional pair of instructions, and wherein the one or more un-conditional memory access operations comprise a single un-conditional store operation.

17. The processor of claim 11, wherein the one or more conditional memory access instructions comprise a read-modify-write instruction, and wherein the one or more un-conditional memory access operations comprise a single un-conditional write operation.

18. A processor comprising:
a plurality of logical processors, including a first logical processor, the first logical processor to execute software that includes one or more conditional memory access instructions;
a decode unit of the first logical processor, the decode unit to convert the one or more conditional memory access instructions to one or more un-conditional memory access operations when the processor is in a relaxed memory access synchronization mode; and one or more architecturally-visible bits to indicate that the processor is in the relaxed memory access synchronization mode, wherein the first logical processor is to access at least a portion of a memory without respecting synchronization when the processor is in the relaxed memory access synchronization mode, wherein the one or more architecturally-visible bits are modifiable by software during runtime to indicate that the processor is in the relaxed memory access synchronization mode when at least one of: (1) only a single thread is running; (2) only one thread will access said at least the portion of the memory; and (3) no other thread will be observing said at least the portion of the memory.

* * * * *